(12) United States Patent
Jeon et al.

(10) Patent No.: US 9,903,901 B2
(45) Date of Patent: Feb. 27, 2018

(54) LEAKAGE CURRENT DETECTION DEVICE AND NONVOLATILE MEMORY DEVICE HAVING THE SAME

(71) Applicants: Byung-Gil Jeon, Suwon-si (KR); Doo-Gon Kim, Hwaseong-si (KR)

(72) Inventors: Byung-Gil Jeon, Suwon-si (KR); Doo-Gon Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 394 days.

(21) Appl. No.: 14/681,137

(22) Filed: Apr. 8, 2015

(65) Prior Publication Data

US 2016/0018453 A1 Jan. 21, 2016

(30) Foreign Application Priority Data

Jul. 15, 2014 (KR) ........................ 10-2014-0089350

(51) Int. Cl.
| | |
|---|---|
| *G01R 31/02* | (2006.01) |
| *G11C 29/02* | (2006.01) |
| *G11C 29/50* | (2006.01) |
| *G11C 11/16* | (2006.01) |
| *G11C 13/00* | (2006.01) |

(52) U.S. Cl.
CPC .......... *G01R 31/025* (2013.01); *G11C 29/023* (2013.01); *G11C 29/025* (2013.01); *G11C 29/026* (2013.01); *G11C 29/50008* (2013.01); *G11C 11/1673* (2013.01); *G11C 13/00* (2013.01); *G11C 2029/5006* (2013.01)

(58) Field of Classification Search
CPC ....................... G11C 29/025; G11C 29/50008
See application file for complete search history.

(56) References Cited

U.S. PATENT DOCUMENTS

| | | | | |
|---|---|---|---|---|
| 6,434,068 | B1 * | 8/2002 | Harada | G11C 29/50 |
| | | | | 365/185.2 |
| 6,813,183 | B2 | 11/2004 | Chevallier | |
| 7,369,433 | B2 * | 5/2008 | Toda | G11C 11/5642 |
| | | | | 365/185.03 |
| 7,532,513 | B2 * | 5/2009 | Chen | G11C 8/08 |
| | | | | 365/185.18 |
| 8,018,772 | B2 | 9/2011 | Chen et al. | |

(Continued)

FOREIGN PATENT DOCUMENTS

JP 2013214342 A 10/2013

*Primary Examiner* — Vanthu Nguyen

(74) *Attorney, Agent, or Firm* — Volentine & Whitt, PLLC

(57) ABSTRACT

A leakage current detection device includes a test detection circuit, a reference detection circuit, a comparator, and a latch circuit. The test detection circuit is coupled between a test node and a test line, provides a voltage to the test node to charge the test line, floats the test node and the test line, and decreases a voltage of the test node based on leakage current of the test line. The reference detection circuit is coupled between a reference node and a reference line, provides the voltage to the reference node to charge the reference line, floats the reference node and the reference line, and decreases a voltage of the reference node based on self-discharge of the reference line. The comparator outputs a comparison signal by comparing voltages of the test node and the reference node. The latch circuit latches the comparison signal to output a test result signal.

19 Claims, 14 Drawing Sheets

(56) References Cited

U.S. PATENT DOCUMENTS

| | | |
|---|---|---|
| 8,085,609 B2 | 12/2011 | Shinoda |
| 8,379,454 B2 * | 2/2013 | Kochar .............. G11C 16/3459 |
| | | 365/185.19 |
| 8,432,732 B2 | 4/2013 | Li et al. |
| 8,588,007 B2 | 11/2013 | Yamada |
| 8,593,876 B2 | 11/2013 | Moschiano et al. |
| 8,634,264 B2 * | 1/2014 | Yamada ................... G11C 8/08 |
| | | 365/189.07 |
| 2010/0125429 A1 | 5/2010 | Yamada |
| 2012/0275228 A1 | 11/2012 | Lu |
| 2016/0254060 A1 * | 9/2016 | Pi .......................... G11C 7/062 |
| | | 365/185.21 |

* cited by examiner

LEAKAGE CURRENT DETECTION DEVICE AND NONVOLATILE MEMORY DEVICE HAVING THE SAME

CROSS-REFERENCE TO RELATED APPLICATION(S)

This application claims priority under 35 USC § 119 to Korean Patent Application No. 10-2014-0089350, filed on Jul. 15, 2014 in the Korean Intellectual Property Office (KIPO), the contents of which are herein incorporated by reference in their entirety.

BACKGROUND

1. Technical Field

Example embodiments relate to a nonvolatile memory device, and more particularly to a leakage current detection device and a nonvolatile memory device including the leakage current detection device.

2. Description of the Related Art

Memory devices can be broadly classified into two groups based on whether they retain stored data when disconnected from power. These groups include volatile memory devices, which lose stored data when disconnected from power, and nonvolatile memory devices, which retain stored data when disconnected from power. Examples of volatile memory devices include dynamic random access memory (DRAM), and static random access memory (SRAM), and examples of nonvolatile memory devices include electrically erasable and programmable read only memory (EEPROM), phase-change random access memory (PRAM), resistance random access memory (RRAM), and magnetic random access memory (MRAM).

EEPROM is one of the more common forms of nonvolatile memory in use today due to its ability to be efficiently programmed, read, and erased. Flash EEPROM (hereafter, "flash memory"), for instance, can be found in a wide range of modern electronic devices, including solid state drives, mobile phones, digital cameras, and many others. Memory cells included in flash memory devices are coupled to drive lines. Flash memory devices perform program, read, and erase operations on the memory cells by applying drive signals to the drive lines.

If a drive line has a defect such that a leakage current flows from the drive line, program, read, and erase operations may not be performed correctly on memory cells coupled to the drive line having a defect. Therefore, data stored in the memory cells coupled to the drive line having a defect may be lost.

SUMMARY

Some example embodiments are directed to a leakage current detection device that effectively detects a leakage current flowing from a drive line coupled to a memory cell array of a nonvolatile memory device.

Some example embodiments are directed to a nonvolatile memory device including the leakage current detection device.

According to example embodiments, a leakage current detection device includes a test detection circuit, a reference detection circuit, a comparator, and a latch circuit. The test detection circuit is coupled between a test node and a test line, which corresponds to a first drive line coupled to a memory cell array of a nonvolatile memory device. The test detection circuit provides a supply voltage to the test node to charge the test line, floats the test node and the test line, and decreases a voltage of the test node based on a leakage current flowing from the test line. The reference detection circuit is coupled between a reference node and a reference line, which corresponds to a second drive line that is coupled to the memory cell array of the nonvolatile memory device and delivers a same type of a drive signal as the first drive line. The reference detection circuit provides the supply voltage to the reference node to charge the reference line, floats the reference node and the reference line, and decreases a voltage of the reference node based on a self-discharge of the reference line. The comparator outputs a comparison signal by comparing the voltage of the test node with the voltage of the reference node. The latch circuit latches the comparison signal in response to a latch control signal, and outputs the latched comparison signal as a test result signal.

In example embodiments, the test detection circuit may include a first charge transistor, which is coupled between the supply voltage and the test node, and includes a gate on which a charge control signal is applied, a first enable transistor, which is coupled between the test node and a ground voltage, and includes a gate on which an enable signal is applied, and a first transmission transistor, which is coupled between the test line and the test node, and includes a gate on which a transmission control signal is applied. The reference detection circuit may include a second charge transistor, which is coupled between the supply voltage and the reference node, and includes a gate on which the charge control signal is applied, a second enable transistor, which is coupled between the reference node and the ground voltage, and includes a gate on which the enable signal is applied, and a second transmission transistor, which is coupled between the reference line and the reference node, and includes a gate on which the transmission control signal is applied.

The leakage current detection device may further include a control circuit. The control circuit may turn off the first enable transistor and the second enable transistor using the enable signal, turn on the first charge transistor and the second charge transistor using the charge control signal, and turn on the first transmission transistor and the second transmission transistor using the transmission control signal at a first time. The control circuit may turn off the first charge transistor and the second charge transistor using the charge control signal to float the test node and the reference node at a second time. The control circuit may provide the latch control signal to the latch circuit at a third time. A time duration between the second time and the third time may correspond to a detection time.

The control circuit may adjust a voltage level of the transmission control signal in a logic high state based on a type of a drive signal that the test line and the reference line deliver. The control circuit may adjust a length of the detection time based on a magnitude of the leakage current of the test line to be detected.

In example embodiments, the comparator may change a logic level of the comparison signal when the voltage of the test node becomes lower than the voltage of the reference node by a predetermined voltage.

In example embodiments, each of the test line and the reference line may correspond to a word line coupled to the memory cell array of the nonvolatile memory device. In example embodiments, each of the test line and the reference line may correspond to a string selection line coupled to the memory cell array of the nonvolatile memory device. In example embodiments, each of the test line and the reference line may correspond to a ground selection line coupled to the memory cell array of the nonvolatile memory device.

According to example embodiments, a nonvolatile memory device includes a memory cell array, a line selection circuit, a leakage current detection device, and a controller. The memory cell array includes a plurality of memory cell blocks. The line selection circuit is coupled to the plurality of memory cell blocks through a plurality of string selection lines, a plurality of word lines, and a plurality of ground selection lines. The line selection circuit couples a test line to one of the plurality of string selection lines, the plurality of word lines, and the plurality of ground selection lines based on a test line selection signal, and couples a reference line to another one of the plurality of string selection lines, the plurality of word lines, and the plurality of ground selection lines based on a reference line selection signal. The leakage current detection device charges the test line and the reference line to a same voltage, floats the test line and the reference line, and generates a test result signal, which indicates whether a leakage current flows from the test line, based on a change of a voltage of the test line and a change of a voltage of the reference line. The controller generates the test line selection signal and the reference line selection signal.

In example embodiments, the leakage current detection device may include a test detection circuit, a reference detection circuit, a comparator, and a latch circuit. The test detection circuit may be coupled between a test node and the test line. The test detection circuit may provide a supply voltage to the test node to charge the test line, float the test node and the test line, and decrease a voltage of the test node based on a leakage current flowing from the test line. The reference detection circuit may be coupled between a reference node and the reference line. The reference detection circuit may provide the supply voltage to the reference node to charge the reference line, float the reference node and the reference line, and decrease a voltage of the reference node based on a self-discharge of the reference line. The comparator may output a comparison signal by comparing the voltage of the test node with the voltage of the reference node. The latch circuit may latch the comparison signal in response to a latch control signal, and output the latched comparison signal as the test result signal.

The test detection circuit include a first charge transistor, which is coupled between the supply voltage and the test node, and includes a gate on which a charge control signal is applied, a first enable transistor, which is coupled between the test node and a ground voltage, and includes a gate on which an enable signal is applied, and a first transmission transistor, which is coupled between the test line and the test node, and includes a gate on which a transmission control signal is applied. The reference detection circuit may include a second charge transistor, which is coupled between the supply voltage and the reference node, and includes a gate on which the charge control signal is applied, a second enable transistor, which is coupled between the reference node and the ground voltage, and includes a gate on which the enable signal is applied, and a second transmission transistor, which is coupled between the reference line and the reference node, and includes a gate on which the transmission control signal is applied.

In example embodiments, when the test line is coupled to one of the plurality of word lines, the reference line may be coupled to another one of the plurality of word lines. When the test line is coupled to one of the plurality of string selection lines, the reference line may be coupled to another one of the plurality of string selection lines. When the test line is coupled to one of the plurality of ground selection lines, the reference line may be coupled to another one of the plurality of ground selection lines.

In example embodiments, the memory cell array may correspond to a three-dimensional memory array.

BRIEF DESCRIPTION OF THE DRAWINGS

Illustrative, non-limiting example embodiments will be more clearly understood from the following detailed description in conjunction with the accompanying drawings.

DETAILED DESCRIPTION OF THE EMBODIMENTS

Figure 1:
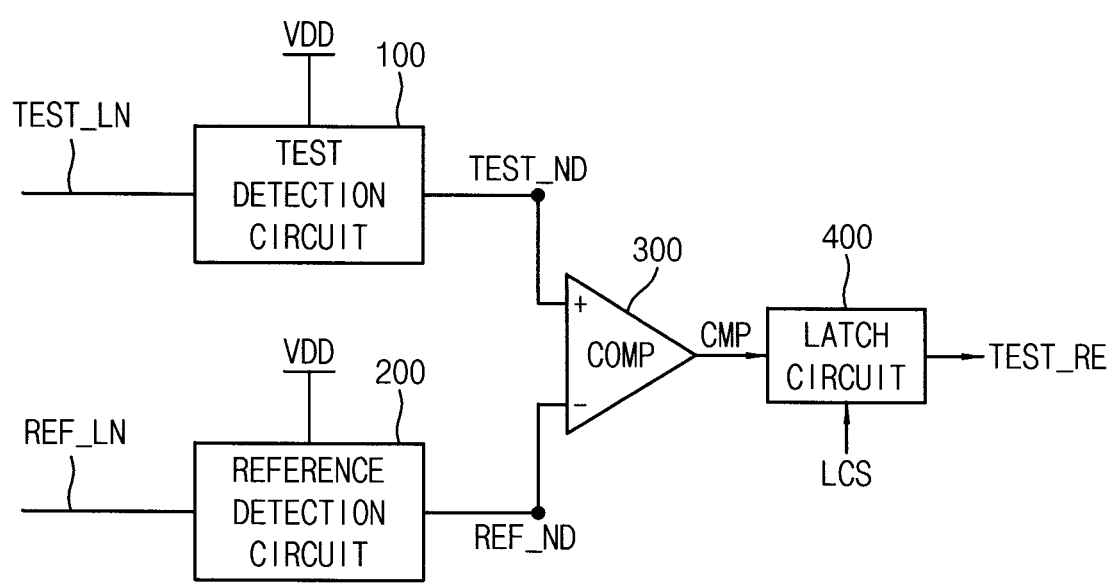
FIG. 1 is a block diagram illustrating a leakage current detection device according to example embodiments.

Various example embodiments will be described more fully with reference to the accompanying drawings, in which some example embodiments are shown. The present inventive concept may, however, be embodied in many different forms and should not be construed as limited to the embodiments set forth herein. Rather, these embodiments are provided so that this disclosure will be thorough and complete, and will fully convey the scope of the present inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a leakage current detection device according to example embodiments. Referring to FIG. 1, a leakage current detection device 10 includes a test detection circuit 100, a reference detection circuit 200, a comparator 300, and a latch circuit 400.

The test detection circuit 100 is coupled between a test node TEST_ND and a test line TEST_LN on which a leakage test operation is performed. The test line TEST_LN corresponds to a first drive line among drive lines coupled to a memory cell array of a nonvolatile memory device. The test detection circuit 100 provides a supply voltage VDD to the test node TEST_ND to charge the test line TEST_LN. After that, the test detection circuit 100 floats the test node TEST_ND and the test line TEST_LN. The test detection circuit 100 decreases a voltage of the test node TEST_ND based on a leakage current flowing from the test line TEST_LN.

The reference detection circuit 200 is coupled between a reference node REF_ND and a reference line REF_LN. The reference line REF_LN corresponds to a second drive line, which is different from the first drive line, among the drive lines coupled to the memory cell array of the nonvolatile memory device. The first drive line and the second drive line may deliver a same type of a drive signal to the memory cell array. The second drive line may not have a defect such that a substantial leakage current may not flow from the second drive line. The reference detection circuit 200 provides the supply voltage VDD to the reference node REF_ND to charge the reference line REF_LN. After that, the reference detection circuit 200 floats the reference node REF_ND and the reference line REF_LN. Since a leakage current does not flow from the reference line REF_LN, the reference detection circuit 200 decreases a voltage of the reference node REF_ND based on a self-discharge of the reference line REF_LN. When a magnitude of the self-discharge of the reference line REF_LN is negligibly small, the voltage of the reference node REF_ND may be maintained without a substantial change after the reference node REF_ND and the reference line REF_LN are floated.

In some example embodiments, each of the test line TEST_LN and the reference line REF_LN may correspond to a word line delivering a word line signal to the memory cell array of the nonvolatile memory device. In some example embodiments, each of the test line TEST_LN and the reference line REF_LN may correspond to a string selection line delivering a string selection signal to the memory cell array of the nonvolatile memory device. In some example embodiments, each of the test line TEST_LN and the reference line REF_LN may correspond to a ground selection line delivering a ground selection signal to the memory cell array of the nonvolatile memory device.

The comparator 300 outputs a comparison signal CMP by comparing the voltage of the test node TEST_ND with the voltage of the reference node REF_ND. In some example embodiments, the comparator 300 may change a logic level of the comparison signal CMP when the voltage of the test node TEST_ND becomes lower than the voltage of the reference node REF_ND by a predetermined voltage. For example, the comparator 300 may output the comparison signal CMP having a logic low level when the voltage of the test node TEST_ND is equal to or higher than a voltage, which is lower than the voltage of the reference node REF_ND by the predetermined voltage. Alternately, the comparator 300 may output the comparison signal CMP having a logic high level when the voltage of the test node TEST_ND is lower than the voltage, which is lower than the voltage of the reference node REF_ND by the predetermined voltage. The latch circuit 400 latches the comparison signal CMP in response to a latch control signal LCS, and output the latched comparison signal as a test result signal TEST_RE, which indicates whether a leakage current flows from the test line TEST_LN.

Figure 2:
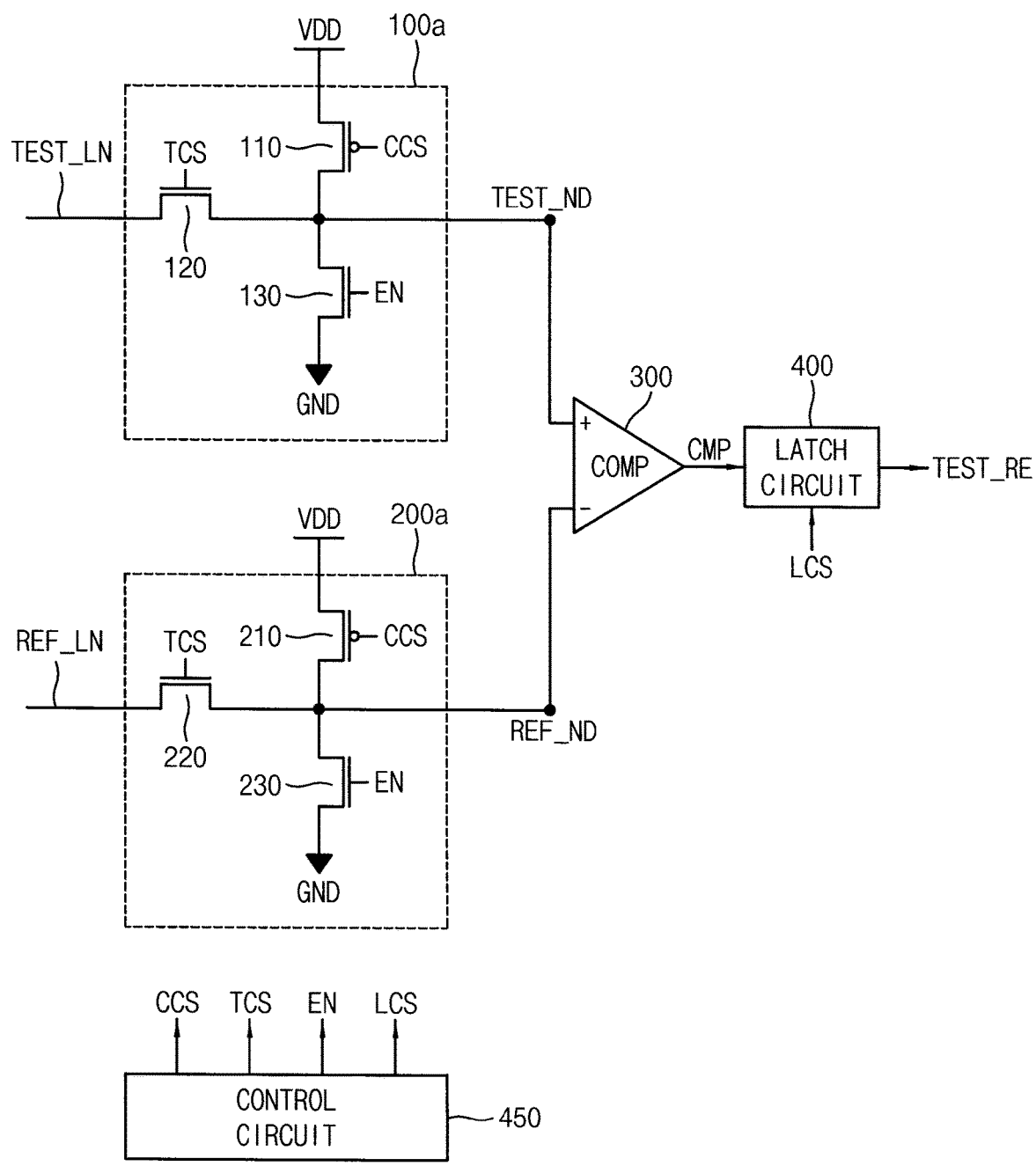
FIG. 2 is a block diagram illustrating an example of a leakage current detection device of FIG. 1.

FIG. 2 is a block diagram illustrating an example of a leakage current detection device of FIG. 1. Referring to FIG. 2, a leakage current detection device 10a may include a test detection circuit 100a, a reference detection circuit 200a, a comparator 300, and a latch circuit 400. The comparator 300 and the latch circuit 400 included in the leakage current detection device 10a of FIG. 2 may be the same as the comparator 300 and the latch circuit 400 included in the leakage current detection device 10 of FIG. 1.

The test detection circuit 100a may include a first charge transistor 110, a first transmission transistor 120, and a first enable transistor 130. The first charge transistor 110 may be coupled between the supply voltage VDD and the test node TEST_ND, and include a gate on which a charge control signal CCS is applied. The first transmission transistor 120 may be coupled between the test line TEST_LN and the test node TEST_ND, and include a gate on which a transmission control signal TCS is applied. The first enable transistor 130 may be coupled between the test node TEST_ND and a ground voltage GND, and include a gate on which an enable signal EN is applied.

The reference detection circuit 200a may include a second charge transistor 210, a second transmission transistor 220, and a second enable transistor 230. The second charge transistor 210 may be coupled between the supply voltage VDD and the reference node REF_ND, and include a gate on which the charge control signal CCS is applied. The second transmission transistor 220 may be coupled between the reference line REF_LN and the reference node REF_ND, and include a gate on which the transmission control signal TCS is applied. The second enable transistor 230 may be coupled between the reference node REF_ND and the ground voltage GND, and include a gate on which the enable signal EN is applied.

In some example embodiments, each of the first charge transistor 110 and the second charge transistor 210 may include a p-type metal oxide semiconductor (PMOS) transistor, and each of the first transmission transistor 120, the second transmission transistor 220, the first enable transistor 130, and the second enable transistor 230 may include an n-type metal oxide semiconductor (NMOS) transistor.

In some example embodiments, the leakage current detection device 10a may further include a control circuit 450 that provides the charge control signal CCS to the first charge transistor 110 and the second charge transistor 210, provides the transmission control signal TCS to the first transmission transistor 120 and the second transmission transistor 220, provides the enable signal EN to the first enable transistor 130 and the second enable transistor 230, and provides the latch control signal LCS to the latch circuit 400.

Figure 3:
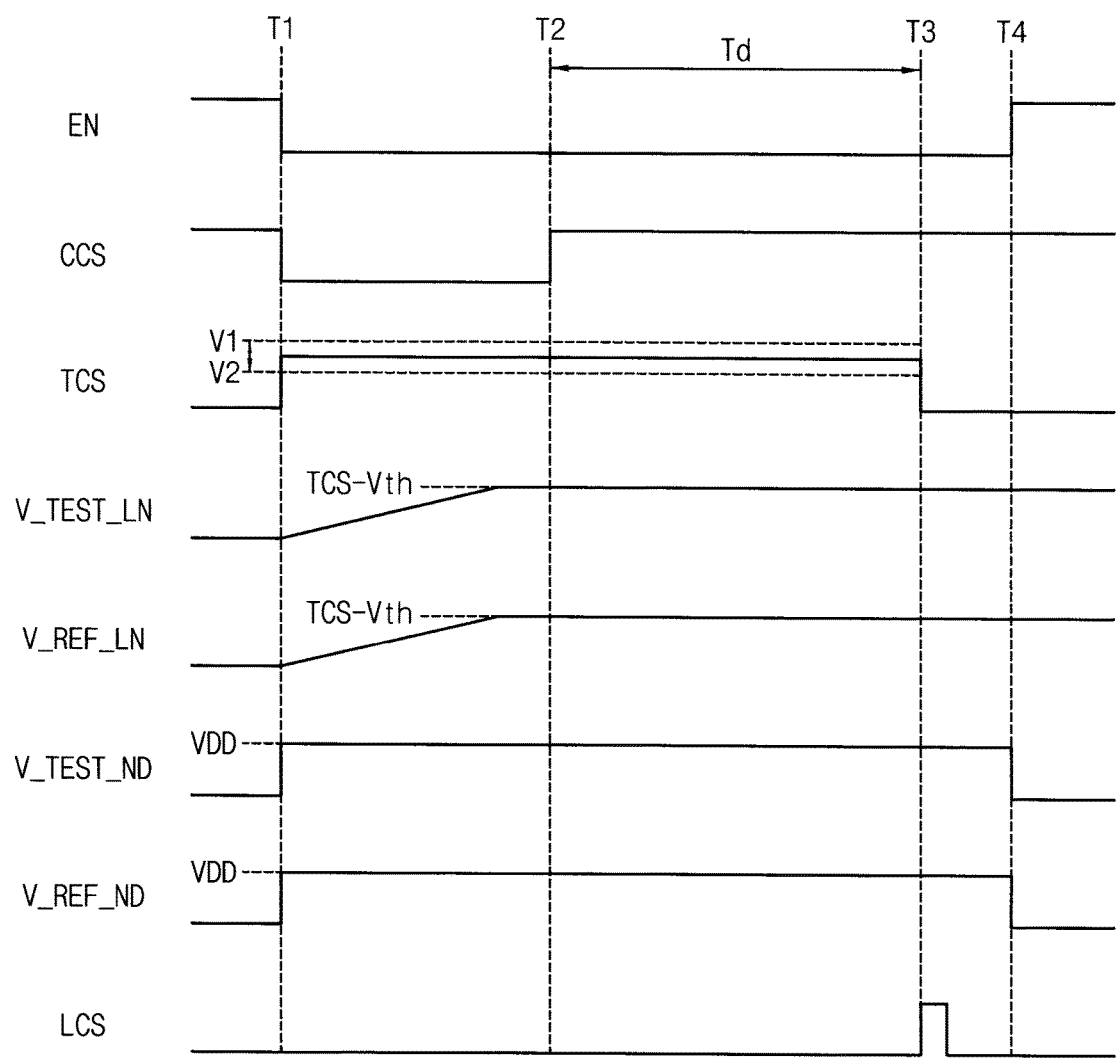
FIGS. 3 and 4 are timing diagrams for describing an operation of the leakage current detection device of FIG. 2.
Figure 4:
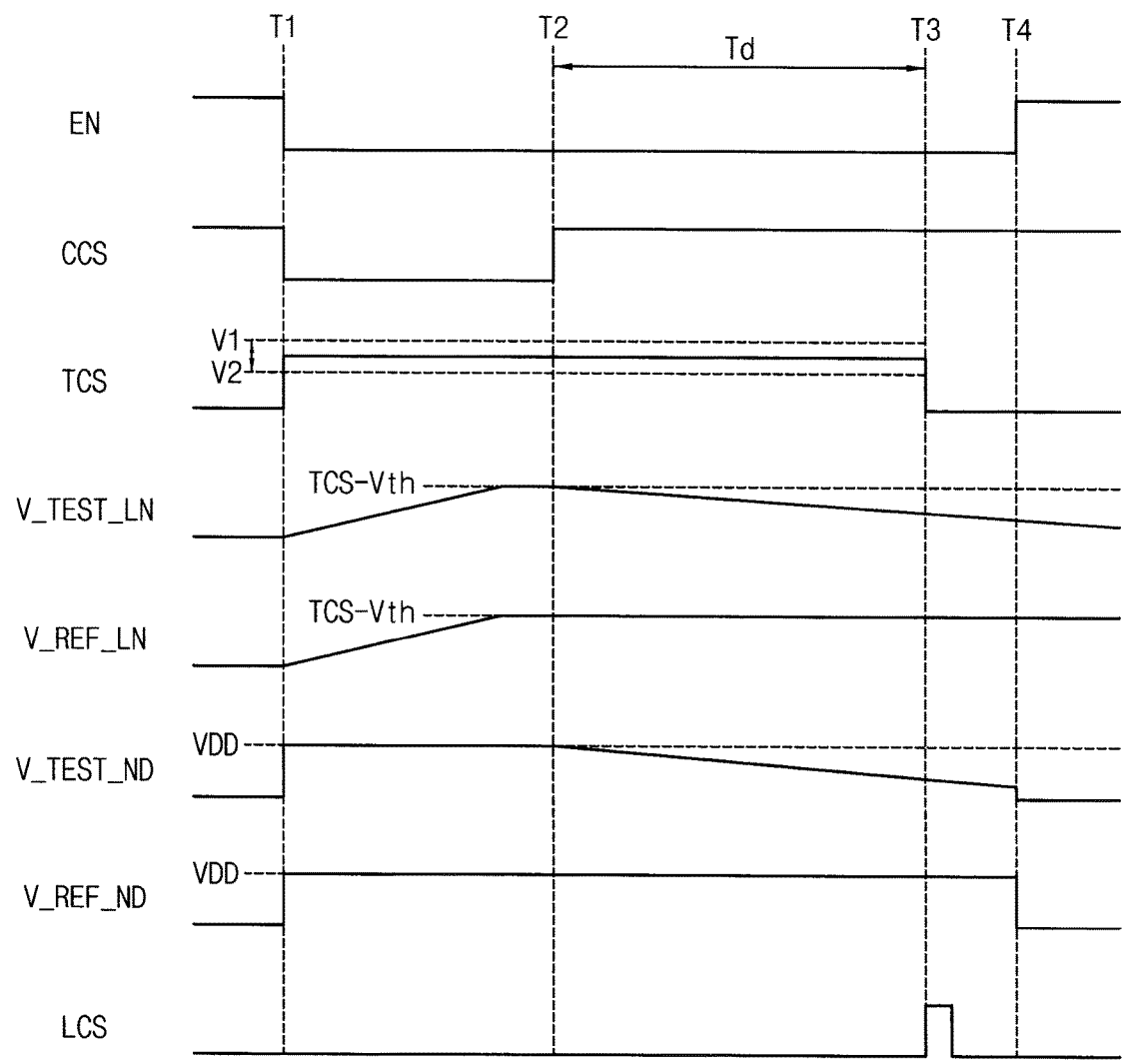

FIGS. 3 and 4 are timing diagrams for describing an operation of the leakage current detection device of FIG. 2. FIG. 3 illustrates an operation of the leakage current detection device 10a of FIG. 2 when a leakage current does not flow from the test line TEST_LN. FIG. 4 illustrates an operation of the leakage current detection device 10a of FIG. 2 when a leakage current flows from the test line TEST_LN.

Hereinafter, an operation of the leakage current detection device 10a of FIG. 2 in the case that a leakage current does not flow from the test line TEST_LN is described with reference to FIGS. 2 and 3. Referring to FIGS. 2 and 3, at a first time T1, the control circuit 450 may provide the enable signal EN having the logic low level to the first enable transistor 130 and the second enable transistor 230 to turn off the first enable transistor 130 and the second enable transistor 230, provide the charge control signal CCS having the logic low level to the first charge transistor 110 and the second charge transistor 210 to turn on the first charge transistor 110 and the second charge transistor 210, and provide the transmission control signal TCS having the logic high level to the first transmission transistor 120 and the second transmission transistor 220 to turn on the first transmission transistor 120 and the second transmission transistor 220.

Therefore, the voltage V_TEST_ND of the test node TEST_ND and the voltage V_REF_ND of the reference node REF_ND may increase to the supply voltage VDD. In addition, the test line TEST_LN and the reference line REF_LN may be charged with charges received from the test node TEST_ND and the reference node REF_ND, respectively, such that the voltage V_TEST_LN of the test line TEST_LN and the voltage V_REF_LN of the reference line REF_LN may also increase. For example, as illustrated in FIG. 3, the test line TEST_LN may be charged up to a voltage that is lower than a voltage of the transmission control signal TCS, which is applied on the gate of the first transmission transistor 120, by a threshold voltage Vth of the first transmission transistor 120. Similarly, the reference line REF_LN may be charged up to a voltage that is lower than a voltage of the transmission control signal TCS, which is applied on the gate of the second transmission transistor 220, by a threshold voltage Vth of the second transmission transistor 220. The threshold voltage Vth of the first transmission transistor 120 may be the same as the threshold voltage Vth of the second transmission transistor 220.

In some example embodiments, the control circuit 450 may adjust a voltage level of the transmission control signal TCS in a logic high state. For example, as illustrated in FIG. 3, the control circuit 450 may adjust the voltage level of the transmission control signal TCS in the logic high state between a first voltage V1 and a second voltage V2 based on a type of a drive signal that the test line TEST_LN and the reference line REF_LN deliver.

For example, when each of the test line TEST_LN and the reference line REF_LN corresponds to a word line of the nonvolatile memory device that delivers a signal having a relatively high voltage, the control circuit 450 may increase the voltage level of the transmission control signal TCS in the logic high state. When each of the test line TEST_LN and the reference line REF_LN corresponds to a string selection line or a ground selection line of the nonvolatile memory device that delivers a signal having a relatively low voltage, the control circuit 450 may decrease the voltage level of the transmission control signal TCS in the logic high state. Therefore, the control circuit 450 may control a charge level of the test line TEST_LN and the reference line REF_LN by adjusting the voltage level of the transmission control signal TCS in the logic high state.

At a second time T2, the control circuit 450 may provide the charge control signal CCS having the logic high level to the first charge transistor 110 and the second charge transistor 210 to turn off the first charge transistor 110 and the second charge transistor 210. Since the test node TEST_ND and the reference node REF_ND are disconnected from the supply voltage VDD and the ground voltage GND, the test node TEST_ND and the reference node REF_ND may be floated. Since the test node TEST_ND and the reference node REF_ND are floated, the test line TEST_LN and the reference line REF_LN may also be floated.

When a leakage current does not flow from the test line TEST_LN, the voltage V_TEST_LN of the test line TEST_LN and the voltage V_TEST_ND of the test node TEST_ND may decrease based on a self-discharge of the test line TEST_LN. Similarly, the voltage V_REF_LN of the reference line REF_LN and the voltage V_REF_ND of the reference node REF_ND may decrease based on the self-discharge of the reference line REF_LN.

As described above, since the test line TEST_LN and the reference line REF_LN deliver a same type of a drive signal to the memory cell array, a magnitude of the self-discharge of the test line TEST_LN may be substantially the same as a magnitude of the self-discharge of the reference line REF_LN. Therefore, a decrease amount of the voltage V_TEST_ND of the test node TEST_ND may be substantially the same as a decrease amount of the voltage V_REF_ND of the reference node REF_ND after the second time T2.

When the magnitude of the self-discharge of the test line TEST_LN and the reference line REF_LN is negligibly small, as illustrated in FIG. 3, the voltage V_TEST_LN of the test line TEST_LN, the voltage V_TEST_ND of the test node TEST_ND, the voltage V_REF_LN of the reference line REF_LN, and the voltage V_REF_ND of the reference node REF_ND may be maintained without a substantial change after the second time T2.

At a third time T3, the control circuit 450 may provide the transmission control signal TCS having the logic low level to the first transmission transistor 120 and the second transmission transistor 220 to turn off the first transmission transistor 120 and the second transmission transistor 220. Therefore, the voltage V_TEST_ND of the test node TEST_ND and the voltage V_REF_ND of the reference node REF_ND may be maintained without a substantial change after the third time T3. In addition, the control circuit 450 may provide the latch control signal LCS having the logic high level to the latch circuit 400 at the third time T3. Therefore, the latch circuit 400 may latch the comparison signal CMP output from the comparator 300 at the third time T3, and output the latched comparison signal as the test result signal TEST_RE. The time duration between the second time T2 and the third time T3 may be referred to as a detection time Td.

As illustrated in FIG. 3, when a leakage current does not flow from the test line TEST_LN, the voltage V_TEST_ND of the test node TEST_ND may be the same as the voltage V_REF_ND of the reference node REF_ND at the third time T3. Therefore, the comparator 300 may output the comparison signal CMP having the logic low level, and the latch circuit 400 may output the test result signal TEST_RE having the logic low level.

At a fourth time T4, the control circuit 450 may provide the enable signal EN having the logic high level to the first enable transistor 130 and the second enable transistor 230 to turn on the first enable transistor 130 and the second enable transistor 230. Therefore, the voltage V_TEST_ND of the test node TEST_ND and the voltage V_REF_ND of the reference node REF_ND may be reset to the ground voltage GND and be maintained at the ground voltage GND. The leakage test operation on the test line TEST_LN may be finished at the fourth time T4.

Hereinafter, an operation of the leakage current detection device 10a of FIG. 2 in the case that a leakage current flows from the test line TEST_LN is described with reference to FIGS. 2 and 4. Referring to FIGS. 2 and 4, at a first time T1, the control circuit 450 may provide the enable signal EN having the logic low level to the first enable transistor 130 and the second enable transistor 230 to turn off the first enable transistor 130 and the second enable transistor 230, provide the charge control signal CCS having the logic low level to the first charge transistor 110 and the second charge transistor 210 to turn on the first charge transistor 110 and the second charge transistor 210, and provide the transmission control signal TCS having the logic high level to the first transmission transistor 120 and the second transmission transistor 220 to turn on the first transmission transistor 120 and the second transmission transistor 220.

Therefore, the voltage V_TEST_ND of the test node TEST_ND and the voltage V_REF_ND of the reference node REF_ND may increase to the supply voltage VDD. In addition, the test line TEST_LN and the reference line REF_LN may be charged with charges received from the test node TEST_ND and the reference node REF_ND, respectively, such that the voltage V_TEST_LN of the test line TEST_LN and the voltage V_REF_LN of the reference line REF_LN may also increase. For example, as illustrated in FIG. 4, the test line TEST_LN may be charged up to a voltage that is lower than a voltage of the transmission control signal TCS, which is applied on the gate of the first transmission transistor 120, by a threshold voltage Vth of the first transmission transistor 120. Similarly, the reference line REF_LN may be charged up to a voltage that is lower than a voltage of the transmission control signal TCS, which is applied on the gate of the second transmission transistor 220, by a threshold voltage Vth of the second transmission transistor 220. The threshold voltage Vth of the first transmission transistor 120 may be the same as the threshold voltage Vth of the second transmission transistor 220.

In some example embodiments, the control circuit 450 may adjust a voltage level of the transmission control signal TCS in a logic high state. For example, as illustrated in FIG. 4, the control circuit 450 may adjust the voltage level of the transmission control signal TCS in the logic high state between a first voltage V1 and a second voltage V2 based on a type of a drive signal that the test line TEST_LN and the reference line REF_LN deliver.

For example, when each of the test line TEST_LN and the reference line REF_LN corresponds to a word line of the nonvolatile memory device that delivers a signal having a relatively high voltage, the control circuit 450 may increase the voltage level of the transmission control signal TCS in the logic high state. When each of the test line TEST_LN and the reference line REF_LN corresponds to a string selection line or a ground selection line of the nonvolatile memory device that delivers a signal having a relatively low voltage, the control circuit 450 may decrease the voltage level of the transmission control signal TCS in the logic high state. Therefore, the control circuit 450 may control a charge level of the test line TEST_LN and the reference line REF_LN by adjusting the voltage level of the transmission control signal TCS in the logic high state.

At a second time T2, the control circuit 450 may provide the charge control signal CCS having the logic high level to the first charge transistor 110 and the second charge transistor 210 to turn off the first charge transistor 110 and the second charge transistor 210. Since the test node TEST_ND and the reference node REF_ND are disconnected from the supply voltage VDD and the ground voltage GND, the test node TEST_ND and the reference node REF_ND may be floated. Since the test node TEST_ND and the reference node REF_ND are floated, the test line TEST_LN and the reference line REF_LN may also be floated.

Therefore, the voltage V_REF_LN of the reference line REF_LN and the voltage V_REF_ND of the reference node REF_ND may decrease based on the self-discharge of the reference line REF_LN. When the magnitude of the self-discharge of the reference line REF_LN is negligibly small, as illustrated in FIG. 4, the voltage V_REF_LN of the reference line REF_LN and the voltage V_REF_ND of the reference node REF_ND may be maintained without a substantial change after the second time T2.

When the test line TEST_LN has a defect such that a leakage current, which has a magnitude substantially greater than the magnitude of the self-discharge, flows from the test line TEST_LN, as illustrated in FIG. 4, the voltage V_TEST_LN of the test line TEST_LN and the voltage V_TEST_ND of the test node TEST_ND may decrease based on the leakage current flowing from the test line TEST_LN, such that the voltage V_TEST_LN of the test line TEST_LN and the voltage V_TEST_ND of the test node TEST_ND may become lower than the voltage V_REF_LN of the reference line REF_LN and the voltage V_REF_ND of the reference node REF_ND, respectively.

At a third time T3, the control circuit 450 may provide the transmission control signal TCS having the logic low level to the first transmission transistor 120 and the second transmission transistor 220 to turn off the first transmission transistor 120 and the second transmission transistor 220. Therefore, the voltage V_TEST_ND of the test node TEST_ND and the voltage V_REF_ND of the reference node REF_ND may be maintained without a substantial change after the third time T3. In addition, the control circuit 450 may provide the latch control signal LCS having the logic high level to the latch circuit 400 at the third time T3. Therefore, the latch circuit 400 may latch the comparison signal CMP output from the comparator 300 at the third time T3, and output the latched comparison signal as the test result signal TEST_RE. The time duration between the second time T2 and the third time T3 may be referred to as the detection time Td.

As illustrated in FIG. 4, when the leakage current flows from the test line TEST_LN, the voltage V_TEST_ND of the test node TEST_ND may be lower than the voltage V_REF_ND of the reference node REF_ND at the third time T3. The comparator 300 may output the comparison signal CMP having the logic low level when the voltage V_TEST_ND of the test node TEST_ND is equal to or higher than a voltage, which is lower than the voltage V_REF_ND of the reference node REF_ND by the predetermined voltage. Alternately, the comparator 300 may output the comparison signal CMP having the logic high level when the voltage V_TEST_ND of the test node TEST_ND is lower than the voltage, which is lower than the voltage V_REF_ND of the reference node REF_ND by the predetermined voltage. The latch circuit 400 may latch the comparison signal CMP output from the comparator 300 at the third time T3, and output the latched comparison signal as the test result signal TEST_RE.

The greater the magnitude of the leakage current flowing from the test line TEST_LN, the greater a decrease rate of the voltage V_TEST_ND of the test node TEST_ND during the detection time Td. Alternately, the smaller the magnitude of the leakage current flowing from the test line TEST_LN, the smaller the decrease rate of the voltage V_TEST_ND of the test node TEST_ND during the detection time Td.

In some example embodiments, the control circuit 450 may adjust a length of the detection time Td based on a minimum magnitude of the leakage current to be detected. The greater the length of the detection time Td, the smaller the minimum magnitude of the leakage current that the leakage current detection device 10a is able to detect.

At a fourth time T4, the control circuit 450 may provide the enable signal EN having the logic high level to the first enable transistor 130 and the second enable transistor 230 to turn on the first enable transistor 130 and the second enable transistor 230. Therefore, the voltage V_TEST_ND of the test node TEST_ND and the voltage V_REF_ND of the reference node REF_ND may be reset to the ground voltage GND and be maintained at the ground voltage GND. The leakage test operation on the test line TEST_LN may be finished at the fourth time T4. Generally, magnitudes of self-discharge of drive lines that deliver a same type of a drive signal to a memory cell array of a nonvolatile memory device may be the same.

As described above with reference to FIGS. 1 to 4, the leakage current detection device 10 may select the test line TEST_LN and the reference line REF_LN that deliver a same type of a drive signal among drive lines coupled to a memory cell array of a nonvolatile memory device. The reference line REF_LN may not have a defect such that a substantial leakage current may not flow from the reference line REF_LN. The leakage current detection device 10 may charge the test line TEST_LN and the reference line REF_LN to the same voltage level. After that, the leakage current detection device 10 may generate the test result signal TEST_RE, which indicates whether a leakage current flows from the test line TEST_LN, by comparing a decrease amount of the voltage V_TEST_ND of the test node TEST_ND, which may be caused by a leakage current flowing from the test line TEST_LN or a self-discharge of the test line TEST_LN, with a decrease in amount of the voltage V_REF_ND of the reference node REF_ND, which may be caused by a self-discharge of the reference line REF_LN.

Therefore, the leakage current detection device 10 according to example embodiments may effectively detect a leakage current flowing from a drive line coupled to the memory cell array of the nonvolatile memory device.

Figure 5:
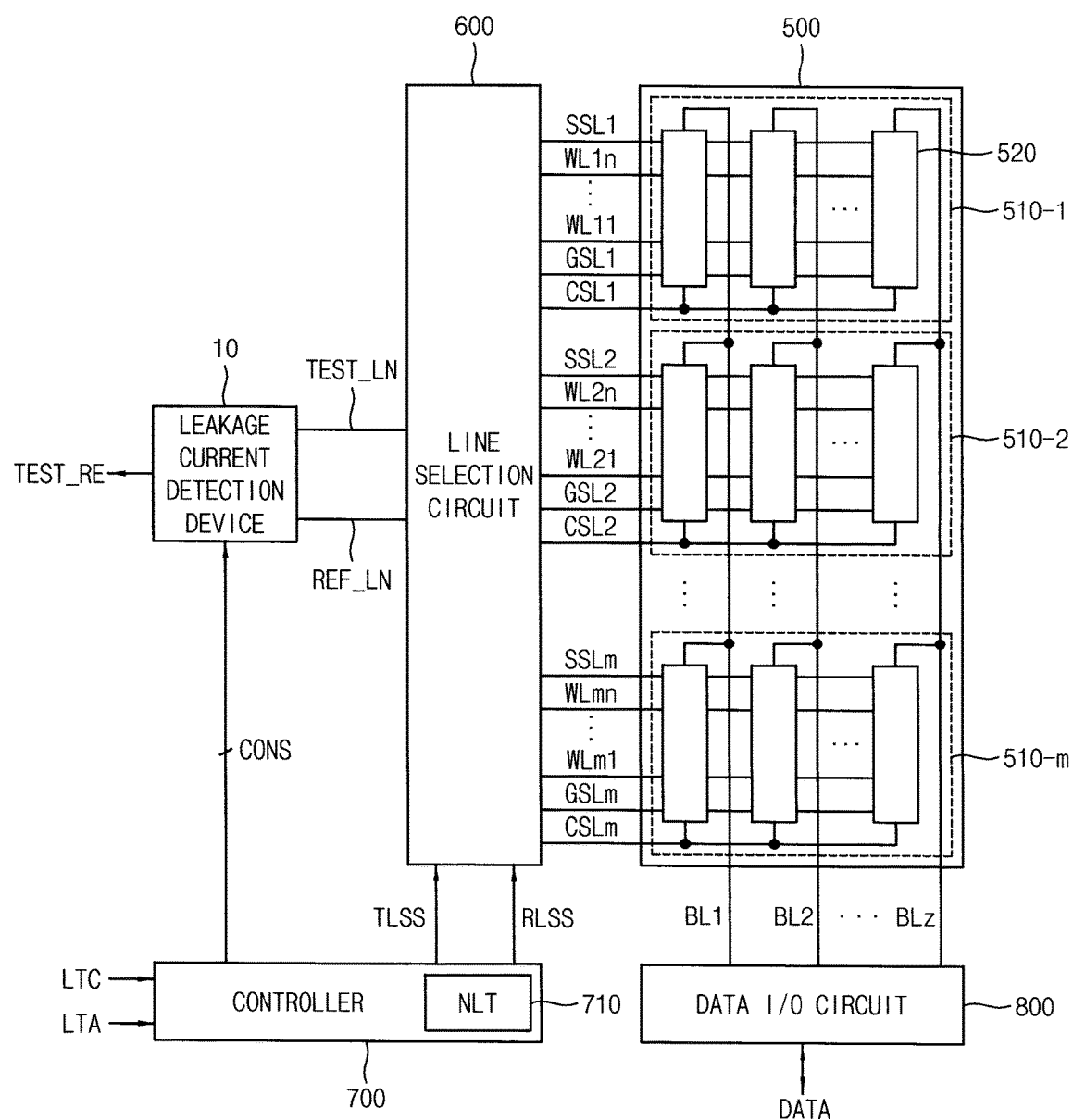
FIG. 5 is a block diagram illustrating a nonvolatile memory device according to example embodiments.

FIG. 5 is a block diagram illustrating a nonvolatile memory device according to example embodiments. Referring to FIG. 5, a nonvolatile memory device 20 includes a memory cell array 500, a line selection circuit 600, a controller 700, a data input/output (I/O) circuit 800, and a leakage current detection device 10.

The memory cell array 500 may include a plurality of memory blocks 510-1, 510-2, . . . , 510-m. The plurality of memory blocks 510-1, 510-2, . . . , 510-m may be coupled to the line selection circuit 600 through a plurality of drive lines. For example, the plurality of memory blocks 510-1, 510-2, . . . , 510-m may be coupled to the line selection circuit 600 through a plurality of string selection lines SSL1, SSL2, . . . , SSLm, a plurality of word lines WL11~WL1n, WL21~WL2n, . . . , WLm1~WLmn, a plurality of ground selection lines GSL1, GSL2, . . . , GSLm, and a plurality of common source lines CSL1, CSL2, . . . , CSLm. In addition, the plurality of memory blocks 510-1, 510-2, . . . , 510-m may be coupled to the data I/O circuit 800 through a plurality of bit lines BL1, BL2, . . . , BLz. Here, n, m, and z represent positive integers. Each of the plurality of memory blocks 510-1, 510-2, . . . , 510-m may include a plurality of memory cell strings 520.

Figure 6A:
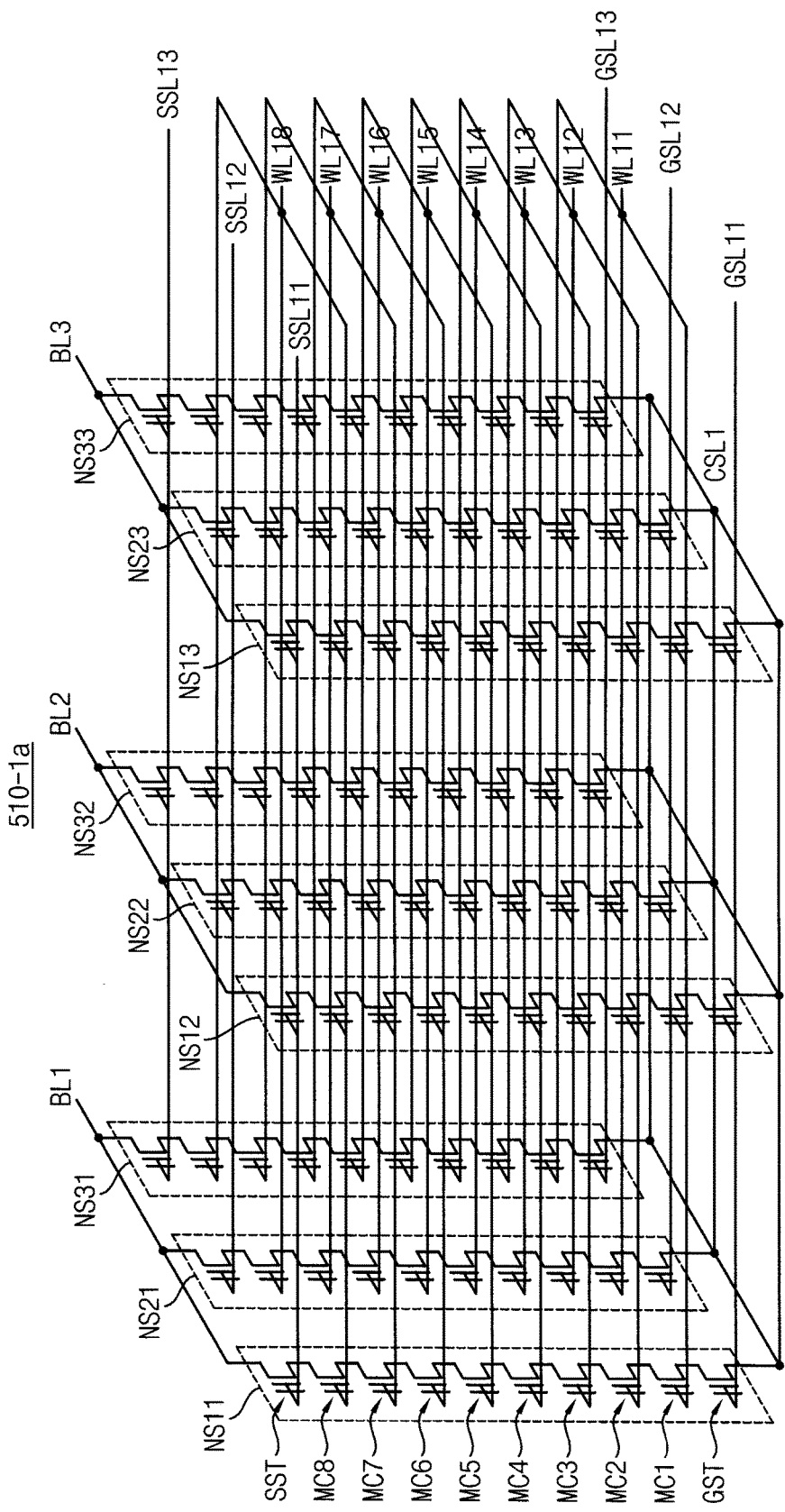
FIGS. 6A and 6B are circuit diagrams illustrating examples of a memory block included in the nonvolatile memory device of FIG. 5.
Figure 6B:
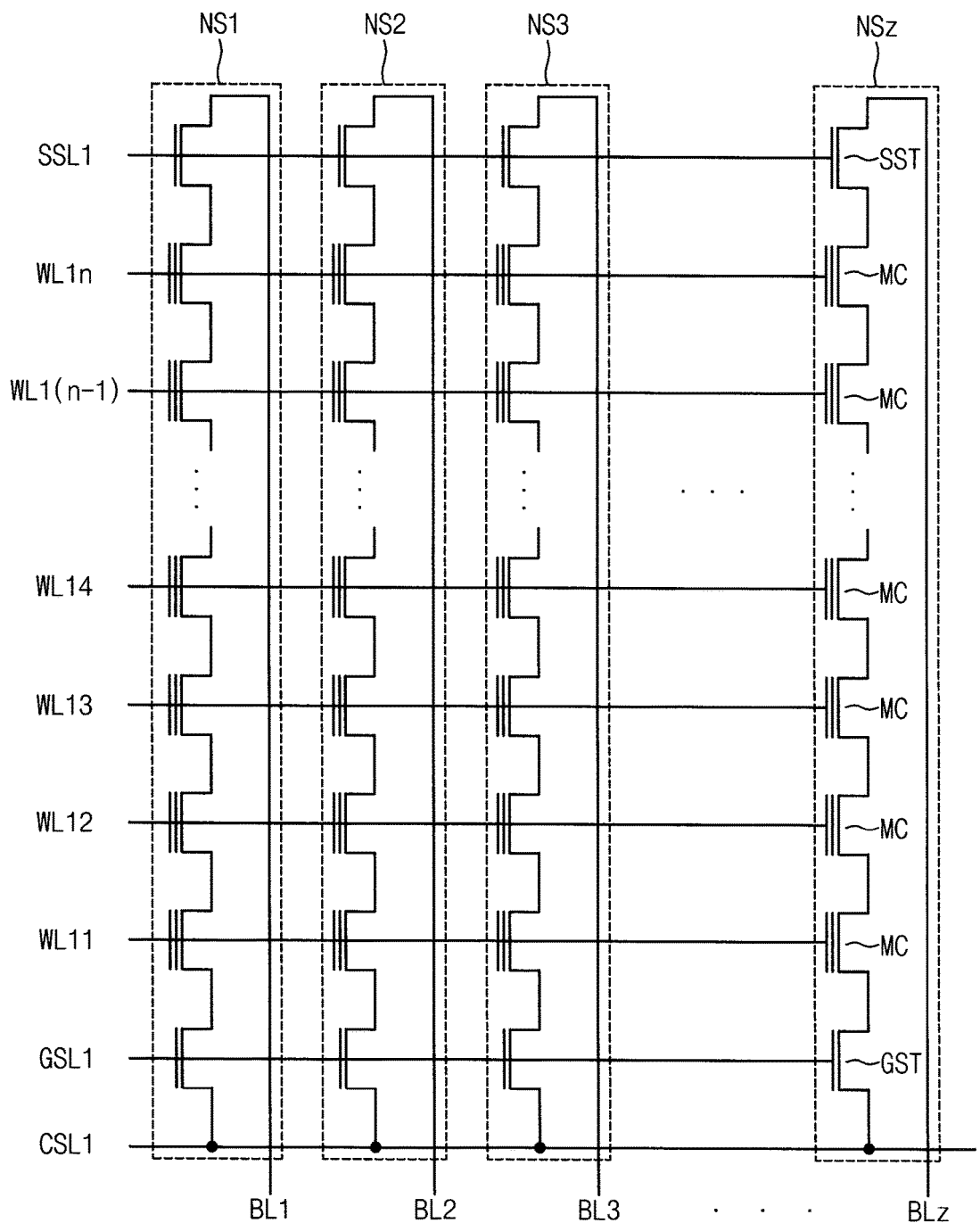

FIGS. 6A and 6B are circuit diagrams illustrating examples of a memory block included in the nonvolatile memory device of FIG. 5. A memory block 510-1a of FIG. 6A may be formed on a substrate in a three-dimensional structure (or vertical structure). For example, the plurality of memory cell strings 520 included in the memory block 510-1a may be formed perpendicular to the substrate.

Referring to FIG. 6A, the memory block 510-1a may include memory cell strings NS11 to NS33 coupled between bit lines BL1, BL2, and BL3 and a common source line CSL1. Each of the memory cell strings NS11 to NS33 may include a string selection transistor SST, a plurality of memory cells MC1, MC1, . . . , MC8, and a ground selection transistor GST.

In FIG. 6A, each of the memory cell strings NS11 to NS33 is illustrated to include eight memory cells MC1, MC1, . . . , MC8. However, example embodiments are not limited thereto. In some example embodiments, each of the memory cell strings NS11 to NS33 may include any number of memory cells.

The string selection transistor SST may be connected to corresponding string selection lines SSL11, SSL12, and SSL13. The plurality of memory cells MC1, MC2, . . . , MC8 may be connected to corresponding word lines WL11, WL12, . . . , WL18, respectively. The ground selection transistor GST may be connected to corresponding ground selection lines GSL11, GSL12, and GSL13. The string selection transistor SST may be connected to corresponding bit lines BL1, BL2 and BL3, and the ground selection transistor GST may be connected to the common source line CSL1. Word lines (e.g., WL1) having the same height may be commonly connected, and the ground selection lines GSL11, GSL12, and GSL13 and the string selection lines SSL11, SSL12, and SSL13 may be separated.

As described above with reference to FIG. 6A, the memory cell array 500 may be a three dimensional (3D) memory array. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. In an embodiment of the present inventive concept, the 3D memory array includes vertical NAND strings that are vertically oriented such that at least one memory cell is located over another memory cell. The at least one memory cell may comprise a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

A memory block 510-1b of FIG. 6B may be formed on a substrate in a two-dimensional structure (or horizontal structure). For example, the plurality of memory cell strings 520 included in the memory block 510-1b may be formed parallel to the substrate. Referring to FIG. 6B, the memory block 510-1b may include memory cell strings NS1, NS2, NS3, . . . , NSz. Each of the memory cell strings NS1, NS2, NS3, . . . , NSz may include a string selection transistor SST, a plurality of memory cells MC, and a ground selection transistor GST that are serially connected to each other.

The string selection transistor SST included in each of the memory cell strings NS1, NS2, NS3, . . . , NSz may be commonly connected to the string selection line SSL1. Memory cells arranged in the same row in the memory cell strings NS1, NS2, NS3, . . . , NSz may be commonly connected to corresponding word lines WL11, WL12, WL13, WL14, . . . , WL1(n−1), WL1n. The ground selection transistor GST included in each of the memory cell strings NS1, NS2, NS3, . . . , NSz may be commonly connected to the ground selection line GSL1.

The ground selection transistors GST included in the memory cell strings NS1, NS2, NS3, . . . , NSz may be commonly connected to the common source line CSL1. The string selection transistor SST included in each of the memory cell strings NS1, NS2, NS3, . . . , NSz may be connected to corresponding bit lines BL1, BL2, BL3, . . . , BLz. Each of the plurality of memory blocks 510-1, 510-2, . . . , 510-m included in the memory cell array 500 of FIG. 5 may be implemented with the memory block 510-1a of FIG. 6A or the memory block 510-1b of FIG. 6B.

As described above with reference to FIGS. 5, 6A, and 6B, since each of the plurality of memory cell strings 520 included in the plurality of memory blocks 510-1, 510-2, . . . , 510-m may have a same structure in which the string selection transistor SST, the memory cells MC, and the ground selection transistors GST are arranged in the same way, parasitic capacitances of drive lines of a same type may be substantially the same. Therefore, magnitudes of a self-discharge of drive lines of a same type may be substantially the same. For example, magnitudes of self-discharge of the plurality of string selection lines SSL1, SSL2, . . . , SSLm may be substantially the same, magnitudes of self-discharge of the plurality of word lines WL11~WL1n, WL21~WL2n, . . . , WLm1~WLmn may be substantially the same, and magnitudes of self-discharge of the plurality of ground selection lines GSL1, GSL2, . . . , GSLm may be substantially the same.

Referring again to FIG. 5, the data I/O circuit 800 may be coupled to the memory cell array 500 through the plurality of bit lines BL1, BL2, . . . , BLz. The data I/O circuit 800 may output data DATA read from the memory cells MC through the plurality of bit lines BL1, BL2, . . . , BLz to an external device, and write data DATA received from the external device in the memory cells MC through the plurality of bit lines BL1, BL2, . . . , BLz. In some example embodiments, the data I/O circuit 800 may include a sense amplifier, a page buffer, a column selection circuit, a write driver, a data buffer, etc.

The line selection circuit 600 may be coupled to the plurality of memory blocks 510-1, 510-2, . . . , 510-m included in the memory cell array 500 through the plurality of string selection lines SSL1, SSL2, . . . , SSLm, the plurality of word lines WL11~WL1n, WL21~WL2n, . . . , WLm1~WLmn, the plurality of ground selection lines GSL1, GSL2, . . . , GSLm, and the plurality of common source lines CSL1, GSL2, . . . , CSLm.

The line selection circuit 600 may receive a test line selection signal TLSS and a reference line selection signal RLSS from the controller 700. The line selection circuit 600 may couple a test line TEST_LN to one of the plurality of string selection lines SSL1, SSL2, . . . , SSLm, the plurality of word lines WL11~WL1n, WL21~WL2n, . . . , WLm1~WLmn, and the plurality of ground selection lines GSL1, GSL2, . . . , GSLm based on the test line selection signal TLSS. The line selection circuit 600 may couple a reference line REF_LN to another one of the plurality of string selection lines SSL1, SSL2, . . . , SSLm, the plurality of word lines WL11~WL1n, WL21~WL2n, . . . , WLm1~WLmn, and the plurality of ground selection lines GSL1, GSL2, . . . , GSLm based on the reference line selection signal RLSS.

In some example embodiments, when the test line TEST_LN is coupled to one of the plurality of word lines WL11~WL1n, WL21~WL2n, . . . , WLm1~WLmn, the reference line REF_LN may be coupled to another one of the plurality of word lines WL11~WL1n, WL21~WL2n, . . . , WLm1~WLmn. When the test line TEST_LN is coupled to one of the plurality of string selection lines SSL1, SSL2, . . . , SSLm, the reference line REF_LN may be coupled to another one of the plurality of string selection lines SSL1, SSL2, . . . , SSLm. When the test line TEST_LN is coupled to one of the plurality of ground selection lines GSL1, GSL2, . . . , GSLm, the reference line REF_LN may be coupled to another one of the plurality of ground selection lines GSL1, GSL2, . . . , GSLm.

In some example embodiments, the test line TEST_LN and the reference line REF_LN may be coupled to drive lines connected to a same memory block. In other example embodiments, the test line TEST_LN and the reference line REF_LN may be coupled to drive lines connected to different memory blocks.

In some example embodiments, the controller 700 may receive a leakage test command LTC and a leakage test address LTA from outside. The controller 700 may generate control signals CONS based on the leakage test command LTC, and generate the test line selection signal TLSS and the reference line selection signal RLSS based on the leakage test address LTA.

In some example embodiments, the controller 700 may include a normal line table NLT 710, which stores addresses of normal lines, from which a substantial leakage current does not flow, among the plurality of string selection lines SSL1, SSL2, . . . , SSLm, the plurality of word lines WL11~WL1n, WL21~WL2n, . . . , WLm1~WLmn, and the plurality of ground selection lines GSL1, GSL2, . . . , GSLm. In this case, the reference line selection signal RLSS generated by the controller 700 may correspond to one of the addresses of the normal lines stored in the normal line table 710.

For example, the controller 700 may generate the test line selection signal TLSS indicating one of the plurality of string selection lines SSL1, SSL2, . . . , SSLm, the plurality of word lines WL11~WL1n, WL21~WL2n, . . . , WLm1~WLmn, and the plurality of ground selection lines GSL1, GSL2, . . . , GSLm that is represented by the leakage test address LTA. In addition, when the leakage test address LTA represents one of the plurality of string selection lines SSL1, SSL2, . . . , SSLm, the controller 700 may generate the reference line selection signal RLSS corresponding to an address of a string selection line among the addresses of the normal lines stored in the normal line table 710. When the leakage test address LTA represents one of the plurality of word lines WL11~WL1n, WL21~WL2n, . . . , WLm1~WLmn, the controller 700 may generate the reference line selection signal RLSS corresponding to an address of a word line among the addresses of the normal lines stored in the normal line table 710. When the leakage test address LTA represents one of the plurality of ground selection lines GSL1, GSL2, . . . , GSLm, the controller 700 may generate the reference line selection signal RLSS corresponding to an address of a ground selection line among the addresses of the normal lines stored in the normal line table 710.

The leakage current detection device 10 may operate based on the control signals CONS provided by the controller 700. The leakage current detection device 10 may charge the test line TEST_LN and the reference line REF_LN to a same voltage, float the test line TEST_LN and the reference line REF_LN, and generate a test result signal TEST_RE, which indicates whether a leakage current flows from the test line TEST_LN, based on a change of a voltage of the test line TEST_LN and a change of a voltage of the reference line REF_LN.

Figure 7:
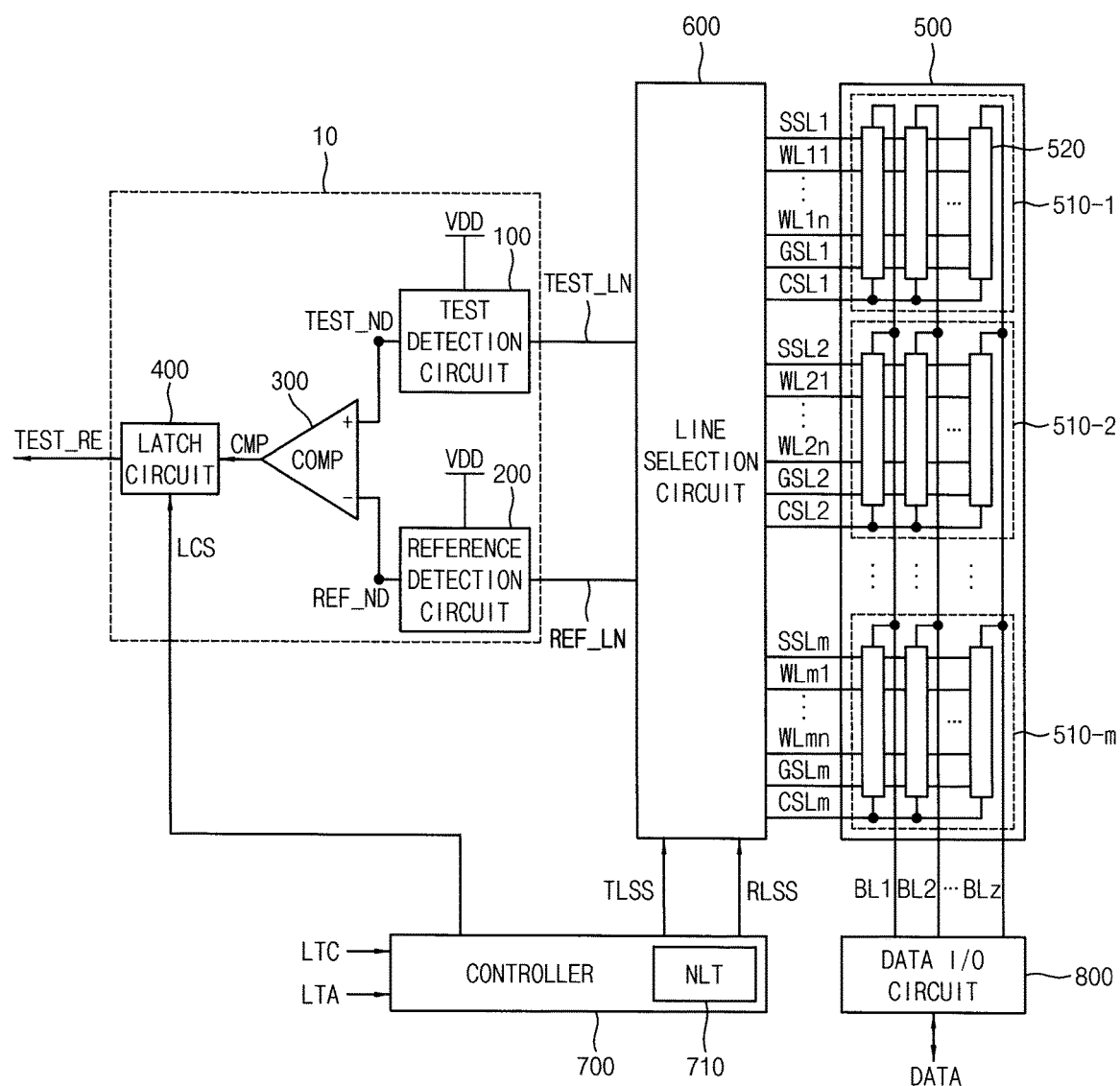
FIG. 7 is a block diagram illustrating an example of a nonvolatile memory device of FIG. 5.

FIG. 7 is a block diagram illustrating an example of a nonvolatile memory device of FIG. 5. Referring to FIG. 7, a nonvolatile memory device 20*a* may include a memory cell array 500, a line selection circuit 600, a controller 700, a data I/O circuit 800, and a leakage current detection device 10. The memory cell array 500, the line selection circuit 600, the controller 700, and the data I/O circuit 800 included in the nonvolatile memory device 20*a* of FIG. 7 may be the same as the memory cell array 500, the line selection circuit 600, the controller 700, and the data I/O circuit 800 included in the nonvolatile memory device 20 of FIG. 5.

The leakage current detection device 10 included in the nonvolatile memory device 20*a* may include a test detection circuit 100, a reference detection circuit 200, a comparator 300, and a latch circuit 400. The test detection circuit 100 may be coupled between a test node TEST_ND and the test line TEST_LN. As described above, the test line TEST_LN may be coupled to one of the plurality of string selection lines SSL1, SSL2, . . . , SSLm, the plurality of word lines WL11~WL1n, WL21~WL2n, . . . , WLm1~WLmn, and the plurality of ground selection lines GSL1, GSL2, . . . , GSLm.

The test detection circuit 100 may provide a supply voltage VDD to the test node TEST_ND to charge the test line TEST_LN. After that, the test detection circuit 100 may float the test node TEST_ND and the test line TEST_LN. The test detection circuit 100 may decrease a voltage of the test node TEST_ND based on a leakage current flowing from the test line TEST_LN.

The reference detection circuit 200 may be coupled between a reference node REF_ND and the reference line REF_LN. As described above, when the test line TEST_LN is coupled to one of the plurality of word lines WL11~WL1n, WL21~WL2n, . . . , WLm1~WLmn, the reference line REF_LN may be coupled to another one of the plurality of word lines WL11~WL1n, WL21~WL2n, . . . , WLm1~WLmn from which a substantial leakage current does not flow. When the test line TEST_LN is coupled to one of the plurality of string selection lines SSL1, SSL2, . . . , SSLm, the reference line REF_LN may be coupled to another one of the plurality of string selection lines SSL1, SSL2, . . . , SSLm from which a substantial leakage current does not flow. When the test line TEST_LN is coupled to one of the plurality of ground selection lines GSL1, GSL2, . . . , GSLm, the reference line REF_LN may be coupled to another one of the plurality of ground selection lines GSL1, GSL2, . . . , GSLm from which a substantial leakage current does not flow.

The reference detection circuit 200 may provide the supply voltage VDD to the reference node REF_ND to charge the reference line REF_LN. After that, the reference detection circuit 200 may float the reference node REF_ND and the reference line REF_LN. Since a leakage current does not flow from the reference line REF_LN, the reference detection circuit 200 may decrease a voltage of the reference node REF_ND based on a self-discharge of the reference line REF_LN. When a magnitude of the self-discharge of the reference line REF_LN is negligibly small, the voltage of the reference node REF_ND may be maintained without a substantial change after the reference node REF_ND and the reference line REF_LN are floated.

The comparator 300 may output a comparison signal CMP by comparing the voltage of the test node TEST_ND with the voltage of the reference node REF_ND. In some example embodiments, the comparator 300 may change a logic level of the comparison signal CMP when the voltage of the test node TEST_ND becomes lower than the voltage of the reference node REF_ND by a predetermined voltage. For example, the comparator 300 may output the comparison signal CMP having a logic low level when the voltage of the test node TEST_ND is equal to or higher than a voltage, which is lower than the voltage of the reference node REF_ND by the predetermined voltage. Alternately, the comparator 300 may output the comparison signal CMP having a logic high level when the voltage of the test node TEST_ND is lower than the voltage, which is lower than the voltage of the reference node REF_ND by the predetermined voltage.

The latch circuit 400 may latch the comparison signal CMP in response to a latch control signal LCS provided by the controller 700, and output the latched comparison signal as a test result signal TEST_RE. Therefore, the test result signal TEST_RE may indicate whether a leakage current flows from a drive line coupled to the test line TEST_LN among the plurality of string selection lines SSL1, SSL2, . . . , SSLm, the plurality of word lines WL11~WL1n, WL21~WL2n, . . . , WLm1~WLmn, and the plurality of ground selection lines GSL1, GSL2, . . . , GSLm.

Figure 8:
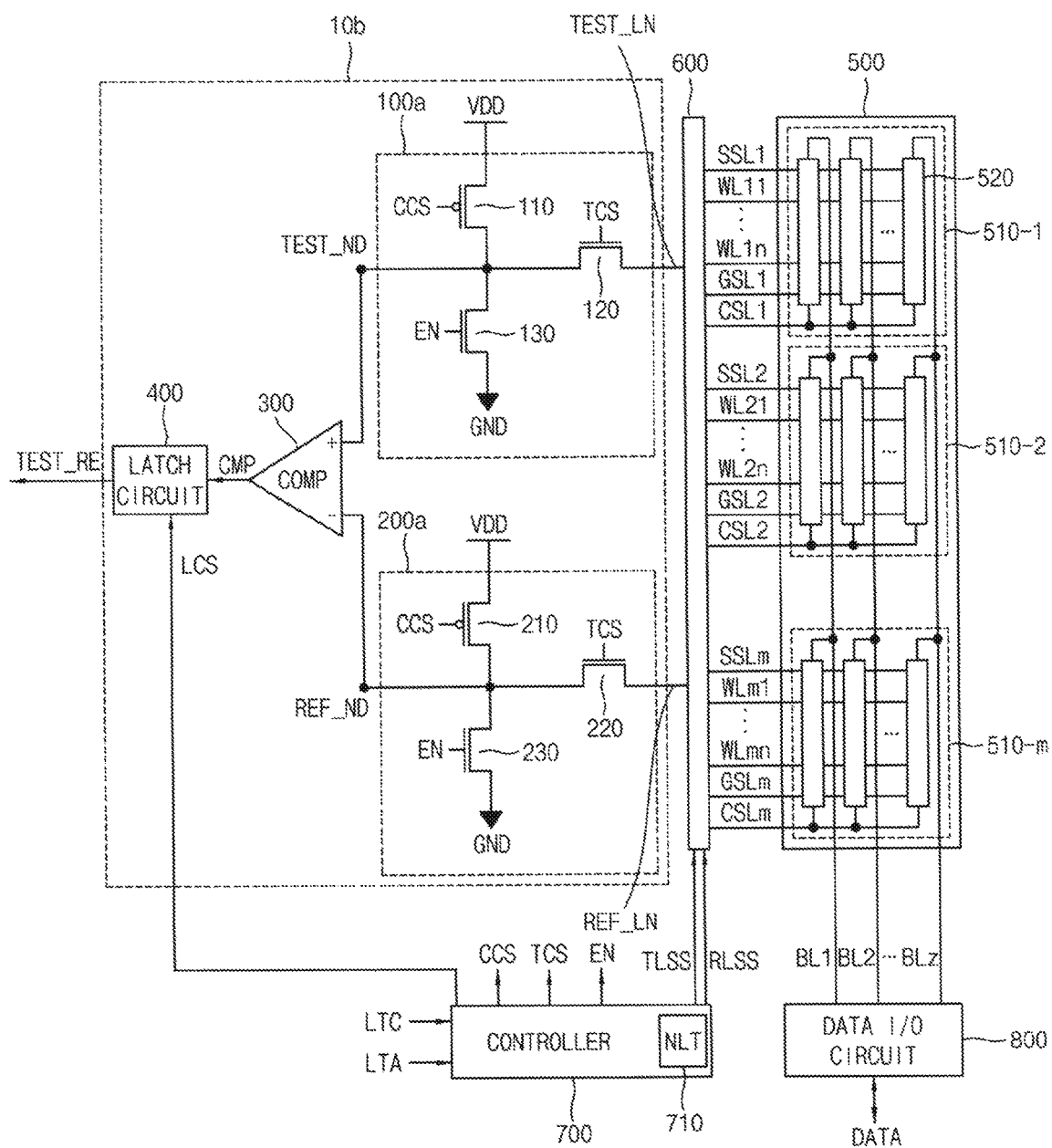
FIG. 8 is a block diagram illustrating an example of a nonvolatile memory device of FIG. 5.

FIG. 8 is a block diagram illustrating an example of a nonvolatile memory device of FIG. 5. Referring to FIG. 8, a nonvolatile memory device 20*b* may include a memory cell array 500, a line selection circuit 600, a controller 700, a data I/O circuit 800, and a leakage current detection device 10*b*. The memory cell array 500, the line selection circuit 600, the controller 700, and the data I/O circuit 800 included in the nonvolatile memory device 20*b* of FIG. 8 may be the same as the memory cell array 500, the line selection circuit 600, the controller 700, and the data I/O circuit 800 included in the nonvolatile memory device 20 of FIG. 5.

The leakage current detection device 10*b* included in the nonvolatile memory device 20*b* may include a test detection circuit 100*a*, a reference detection circuit 200*a*, a comparator 300, and a latch circuit 400. The test detection circuit 100*a* may include a first charge transistor 110, a first transmission transistor 120, and a first enable transistor 130. The first charge transistor 110 may be coupled between the supply voltage VDD and the test node TEST_ND, and include a gate on which a charge control signal CCS is applied. The first transmission transistor 120 may be coupled between the test line TEST_LN and the test node TEST_ND, and include a gate on which a transmission control signal TCS is applied. The first enable transistor 130 may be coupled between the test node TEST_ND and a ground voltage GND, and include a gate on which an enable signal EN is applied.

The reference detection circuit 200a may include a second charge transistor 210, a second transmission transistor 220, and a second enable transistor 230. The second charge transistor 210 may be coupled between the supply voltage VDD and the reference node REF_ND, and include a gate on which the charge control signal CCS is applied. The second transmission transistor 220 may be coupled between the reference line REF_LN and the reference node REF_ND, and include a gate on which the transmission control signal TCS is applied. The second enable transistor 230 may be coupled between the reference node REF_ND and the ground voltage GND, and include a gate on which the enable signal EN is applied.

In some example embodiments, each of the first charge transistor 110 and the second charge transistor 210 may include a p-type metal oxide semiconductor (PMOS) transistor, and each of the first transmission transistor 120, the second transmission transistor 220, the first enable transistor 130, and the second enable transistor 230 may include an n-type metal oxide semiconductor (NMOS) transistor.

The controller 700 may provide the charge control signal CCS to the first charge transistor 110 and the second charge transistor 210, provide the transmission control signal TCS to the first transmission transistor 120 and the second transmission transistor 220, provide the enable signal EN to the first enable transistor 130 and the second enable transistor 230, and provide the latch control signal LCS to the latch circuit 400 based on the leakage test command LTC.

The test detection circuit 100a, the reference detection circuit 200a, the comparator 300, and the latch circuit 400 included in the leakage current detection device 10b of FIG. 8 may be the same as the test detection circuit 100a, the reference detection circuit 200a, the comparator 300, and the latch circuit 400 included in the leakage current detection device 10a of FIG. 2. In addition, the controller 700 included in the nonvolatile memory device 20b of FIG. 8 may perform the operation of the control circuit 450 included in the leakage current detection device 10a of FIG. 2.

As described above with reference to FIGS. 1 to 8, the nonvolatile memory device 20 including the leakage current detection device 10 may couple the test line TEST_LN and the reference line REF_LN to drive lines of a same type among the plurality of string selection lines SSL1, SSL2, . . . , SSLm, the plurality of word lines WL11~WL1n, WL21~WL2n, . . . , WLm1~WLmn, and the plurality of ground selection lines GSL1, GSL2, . . . , GSLm. The drive line to which the reference line REF_LN is coupled may not have a defect such that a substantial leakage current may not flow from the drive line. The nonvolatile memory device 20 may charge the test line TEST_LN and the reference line REF_LN to the same voltage level. After that, the nonvolatile memory device 20 may generate the test result signal TEST_RE, which indicates whether a leakage current flows from the test line TEST_LN, by comparing a decrease amount of the voltage V_TEST_ND of the test node TEST_ND, which may be caused by a leakage current flowing from the test line TEST_LN or a self-discharge of the test line TEST_LN, with a decrease amount of the voltage V_REF_ND of the reference node REF_ND, which may be caused by a self-discharge of the reference line REF_LN.

Therefore, the nonvolatile memory device 20 including the leakage current detection device 10 according to example embodiments may effectively detect a leakage current flowing from the plurality of string selection lines SSL1, SSL2, . . . , SSLm, the plurality of word lines WL11~WL1n, WL21~WL2n, . . . , WLm1~WLmn, and the plurality of ground selection lines GSL1, GSL2, . . . , GSLm.

Figure 9:
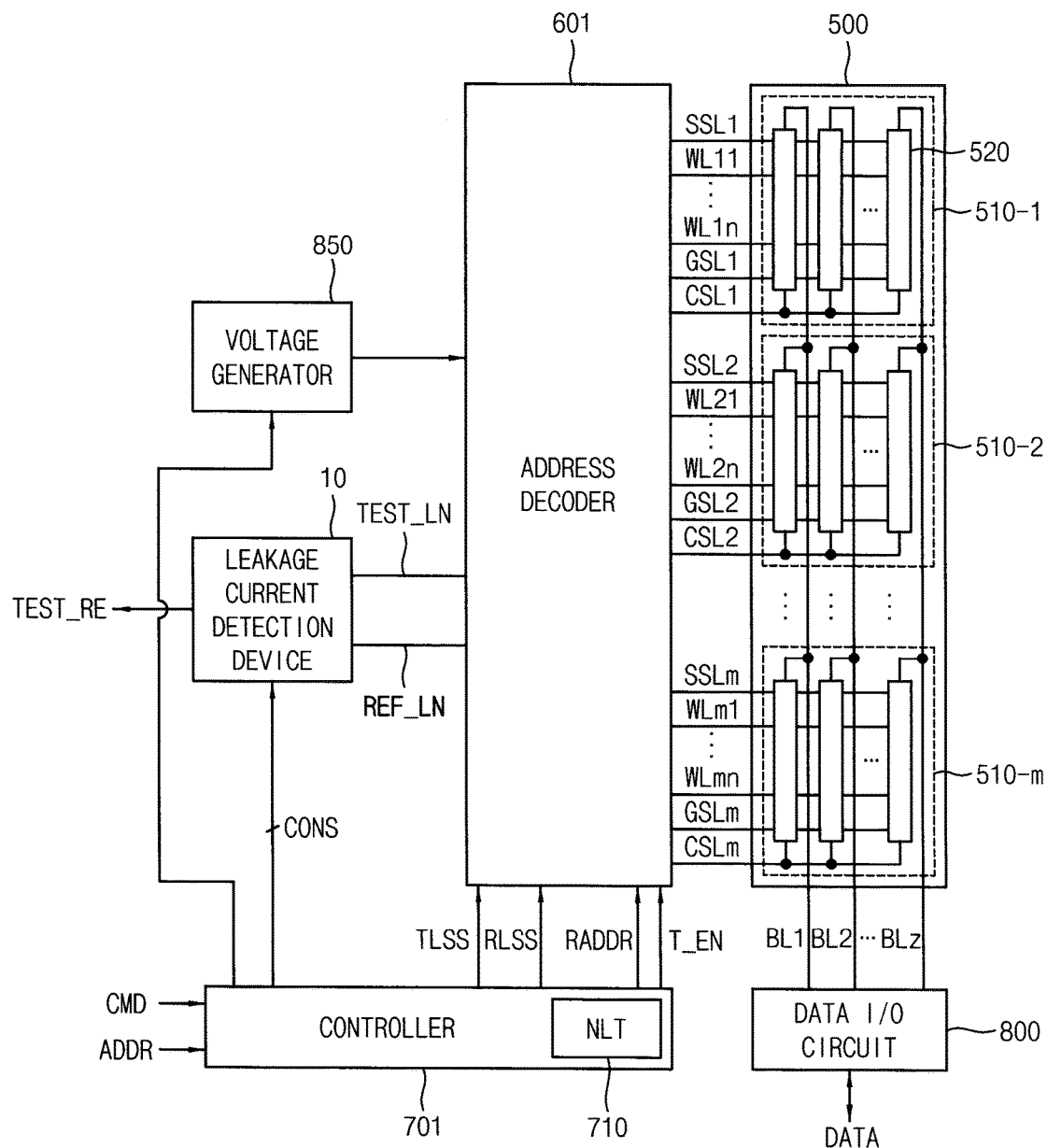
FIG. 9 is a block diagram illustrating a nonvolatile memory device according to example embodiments.

FIG. 9 is a block diagram illustrating a nonvolatile memory device according to example embodiments. Referring to FIG. 9, a nonvolatile memory device 30 may include a memory cell array 500, an address decoder 601, a controller 701, a data I/O circuit 800, a voltage generator 850, and a leakage current detection device 10. The memory cell array 500 included in the nonvolatile memory device 30 of FIG. 9 may be the same as the memory cell array 500 included in the nonvolatile memory device 20 of FIG. 5.

The controller 701 may control overall operations of the nonvolatile memory device 30 based on a command signal CMD and an address signal ADDR received from an external device such as a memory controller. For example, the controller 701 may control a program operation, a read operation, the erase operation, and a leakage test operation of the nonvolatile memory device 30 based on the command signal CMD and the address signal ADDR.

In some example embodiments, the controller 701 may include a normal line table NLT 710, which stores addresses of normal lines, from which a substantial leakage current does not flow, among the plurality of string selection lines SSL1, SSL2, . . . , SSLm, the plurality of word lines WL11~WL1n, WL21~WL2n, . . . , WLm1~WLmn, and the plurality of ground selection lines GSL1, GSL2, . . . , GSLm. When the controller 701 receives the command signal CMD that does not correspond to a leakage test command, the controller 701 may provide a test enable signal T_EN in a deactivated state to the address decoder 601. In this case, the controller 701 may generate a row address RADDR and a column address CADDR based on the address signal ADDR. The controller 701 may provide the row address RADDR to the address decoder 601, and provide the column address CADDR (not shown) to the data I/O circuit 800.

The voltage generator 850 may generate various voltages required for operations of the nonvolatile memory device 30, and provide the various voltages to the address decoder 601. For example, the voltage generator 850 may generate a program voltage, a pass voltage and a verification voltage that are used in the program operation, generate a read voltage that is used in the read operation, and generate an erase voltage that is used in the erase operation.

The address decoder 601 may be connected to the memory cell array 500 through the plurality of string selection lines SSL1, SSL2, . . . , SSLm, the plurality of word lines WL11~WL1n, WL21~WL2n, . . . , WLm1~WLmn, the plurality of ground selection lines GSL1, GSL2, . . . , GSLm, and the plurality of common source lines CSL1, CSL2, . . . , CSLm. When the address decoder 601 receives the test enable signal T_EN in the deactivated state, the address decoder 601 may select one of the plurality of word lines WL11~WL1n, WL21~WL2n, . . . , WLm1~WLmn based on the row address RADDR received from the controller 701, and provide the various voltages received from the voltage generator 850 to the selected word line and the unselected word lines.

The data I/O circuit 800 may be connected to the memory cell array 500 through the plurality of bit lines BL1, BL2, . . . , BLz. The data I/O circuit 800 may select at least one of the plurality of bit lines BL1, BL2, . . . , BLz based on the column address CADDR received from the controller 701, output data DATA read from a memory cell connected to the selected at least one bit line to an external device, and write data DATA received from the external device in a memory cell connected to the selected at least one bit line.

In some example embodiments, the data I/O circuit 800 may include a sense amplifier, a page buffer, a column selection circuit, a write driver, a data buffer, etc.

Alternately, when the controller 701 receives the command signal CMD that corresponds to the leakage test command, the controller 701 may provide the test enable signal T_EN in an activated state to the address decoder 601. In this case, the controller 701 may generate a test line selection signal TLSS and a reference line selection signal RLSS based on the address signal ADDR, and provide the test line selection signal TLSS and the reference line selection signal RLSS to the address decoder 601.

For example, the controller 701 may generate the test line selection signal TLSS indicating one of the plurality of string selection lines SSL1, SSL2, . . . , SSLm, the plurality of word lines WL11~WL1n, WL21~WL2n, . . . , WLm1~WLmn, and the plurality of ground selection lines GSL1, GSL2, . . . , GSLm that is represented by the address signal ADDR. In addition, when the address signal ADDR represents one of the plurality of string selection lines SSL1, SSL2, . . . , SSLm, the controller 701 may generate the reference line selection signal RLSS corresponding to an address of a string selection line among the addresses of the normal lines stored in the normal line table 710. When the address signal ADDR represents one of the plurality of word lines WL11~WL1n, WL21~WL2n, . . . , WLm1~WLmn, the controller 701 may generate the reference line selection signal RLSS corresponding to an address of a word line among the addresses of the normal lines stored in the normal line table 710. When the address signal ADDR represents one of the plurality of ground selection lines GSL1, GSL2, . . . , GSLm, the controller 701 may generate the reference line selection signal RLSS corresponding to an address of a ground selection line among the addresses of the normal lines stored in the normal line table 710.

When the address decoder 601 receives the test enable signal T_EN in the activated state, the address decoder 601 may connect a test line TEST_LN to one of the plurality of string selection lines SSL1, SSL2, . . . , SSLm, the plurality of word lines WL11~WL1n, WL21~WL2n, . . . , WLm1~WLmn, and the plurality of ground selection lines GSL1, GSL2, . . . , GSLm based on the test line selection signal TLSS, and connect a reference line REF_LN to another one of the plurality of string selection lines SSL1, SSL2, . . . , SSLm, the plurality of word lines WL11~WL1n, WL21~WL2n, . . . , WLm1~WLmn, and the plurality of ground selection lines GSL1, GSL2, . . . , GSLm based on the reference line selection signal RLSS.

The leakage current detection device 10 included in the nonvolatile memory device 30 of FIG. 9 may be the same as the leakage current detection device 10 included in the nonvolatile memory device 20 of FIG. 5. Therefore, when the nonvolatile memory device 30 including the leakage current detection device 10 receives the command signal CMD corresponding to the leakage test command from an external device such as a memory controller, the nonvolatile memory device 30 may perform a leakage test on one of the plurality of string selection lines SSL1, SSL2, . . . , SSLm, the plurality of word lines WL11~WL1n, WL21~WL2n, . . . , WLm1~WLmn, and the plurality of ground selection lines GSL1, GSL2, . . . , GSLm that is represented by the address signal ADDR, and provide a test result signal TEST_RE to the memory controller.

Therefore, the memory controller may effectively determine whether a leakage current flows from a drive line corresponding to the address signal ADDR based on the test result signal TEST_RE. When the memory controller determines that a leakage current flows from the drive line corresponding to the address signal ADDR, the memory controller may consider a memory block, which is coupled to the drive line corresponding to the address signal ADDR among plurality of memory blocks 510-1, 510-2, . . . , 510-m, as a bad memory block. After that, the memory controller may not use the bad memory block as a storage medium.

Figure 10:
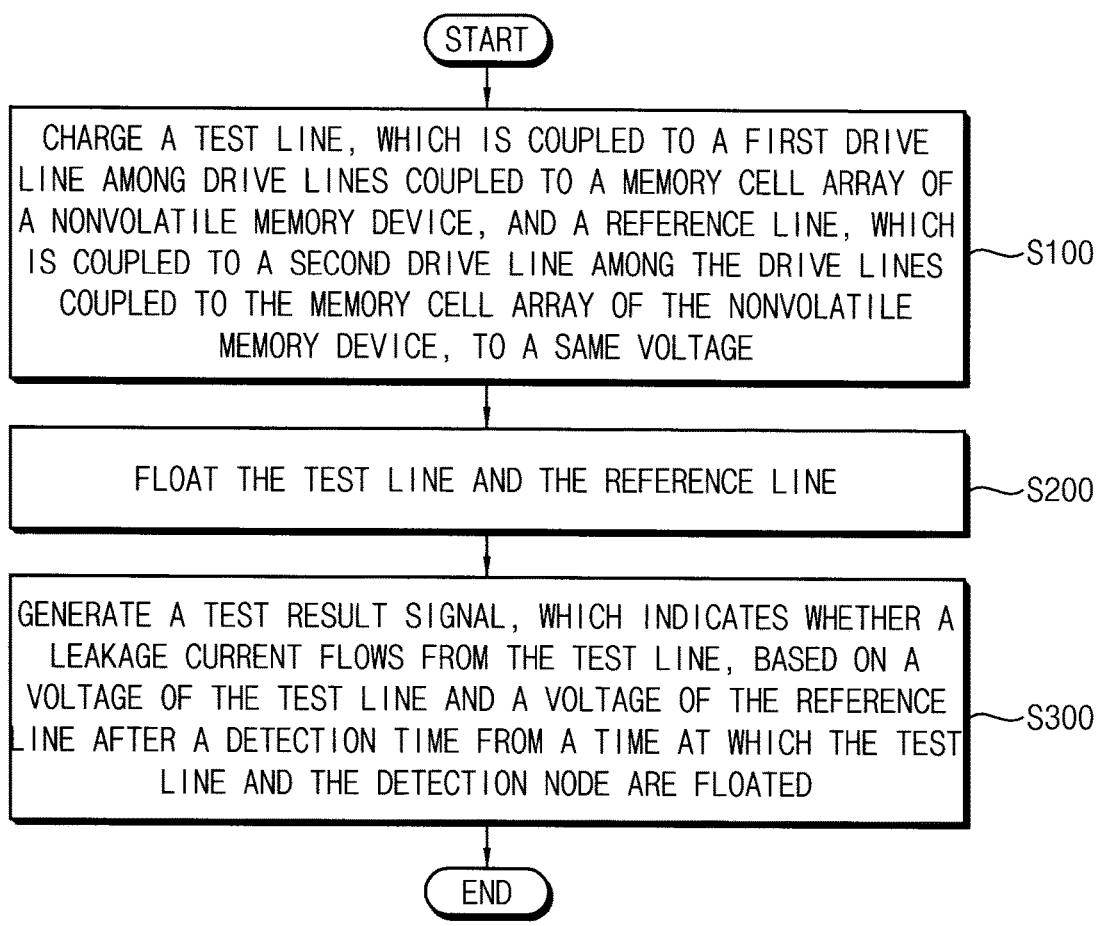
FIG. 10 is a flow chart illustrating a method of detecting a leakage current in a nonvolatile memory device according to example embodiments.

FIG. 10 is a flow chart illustrating a method of detecting a leakage current in a nonvolatile memory device according to example embodiments. In FIG. 10, a method of detecting a leakage current flowing from a drive line coupled to a memory cell array of the nonvolatile memory device is represented. Referring to FIG. 10, a test line, which is coupled to a first drive line among drive lines coupled to a memory cell array of a nonvolatile memory device, and a reference line, which is coupled to a second drive line among the drive lines coupled to the memory cell array of the nonvolatile memory device, are charged to a same voltage (step S100). The first drive line and the second drive line deliver a same type of a drive signal to the memory cell array.

In some example embodiments, a supply voltage may be provided to a test node, which is coupled to the test line through a first transmission transistor, and a reference node, which is coupled to the reference line through a second transmission transistor, and the first transmission transistor and the second transmission transistor may be turned on to charge the test line and the reference line to the same voltage level.

In some example embodiments, each of the test line and the reference line may correspond to a word line delivering a word line signal to the memory cell array of the nonvolatile memory device. In some example embodiments, each of the test line and the reference line may correspond to a string selection line delivering a string selection signal to the memory cell array of the nonvolatile memory device. In some example embodiments, each of the test line and the reference line may correspond to a ground selection line delivering a ground selection signal to the memory cell array of the nonvolatile memory device.

The second drive line, which is coupled to the reference line, may not have a defect such that a substantial leakage current may not flow from the second drive line.

After that, the test line and the reference line are floated (step S200).

In some example embodiments, the test node and the reference node may be disconnected from the supply voltage while the first transmission transistor and the second transmission transistor are turned on such that the test line and the reference line may be floated. A test result signal, which indicates whether a leakage current flows from the test line, is generated based on a voltage of the test line and a voltage of the reference line after a detection time from a time at which the test line and the detection node are floated (step S300).

In some example embodiments, a logic level of the test result signal may be changed when a voltage of the test node is lower than a voltage of the reference node by a predetermined voltage after the detection time from a time at which the test node and the reference node are disconnected from the supply voltage. The method of detecting a leakage current in a nonvolatile memory device illustrated in FIG. 10 may be performed by the nonvolatile memory device 20 of FIG. 5 or the nonvolatile memory device 30 of FIG. 9.

Figure 11:
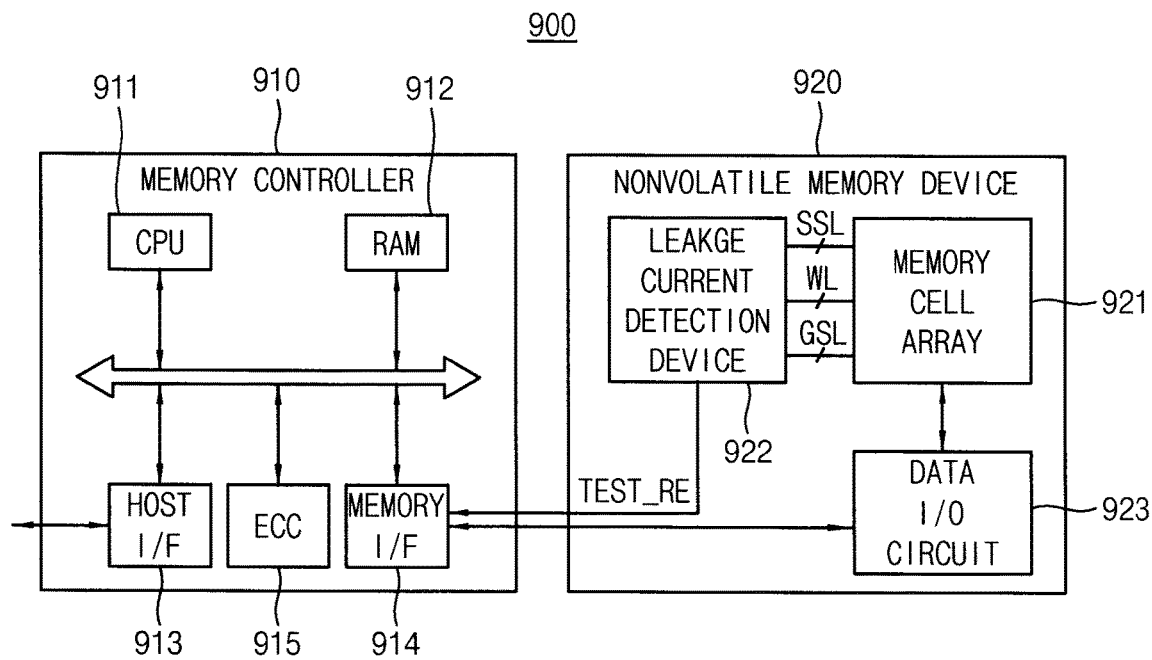
FIG. 11 is a block diagram illustrating a memory system according to example embodiments.

FIG. 11 is a block diagram illustrating a memory system according to example embodiments. Referring to FIG. 11, a memory system 900 includes a memory controller 910 and a nonvolatile memory device 920. The nonvolatile memory device 920 includes a memory cell array 921, a leakage current detection device 922 and a data I/O circuit 923. The memory cell array 921 may include a plurality of memory blocks. The plurality of memory blocks may be coupled to the leakage current detection device 922 through a plurality of string selection lines SSL, a plurality of word lines WL, and a plurality of ground selection lines GSL.

The leakage current detection device 922 may select one of the plurality of string selection lines SSL, the plurality of word lines WL, and the plurality of ground selection lines GSL as a test line, and select another one of the plurality of string selection lines SSL, the plurality of word lines WL, and the plurality of ground selection lines GSL as a reference line. The reference line may be of the same type as the test line. A substantial leakage current may not flow from the reference line. The leakage current detection device 922 may charge the test line and the reference line to the same voltage level. After that, the leakage current detection device 922 may float the test line and the reference line. The leakage current detection device 922 may generate a test result signal TEST_RE, which indicates whether a leakage current flows from the test line, based on a change of a voltage of the test line and a change of a voltage of the reference line, and provide the test result signal TEST_RE to the memory controller 910.

The data I/O circuit 923 may be connected to the memory cell array 921 through a plurality of bit lines. The data I/O circuit 923 may select at least one of the plurality of bit lines, output data read from a memory cell connected to the selected at least one bit line to the memory controller 910, and write data received from the memory controller 910 in a memory cell connected to the selected at least one bit line.

The nonvolatile memory device 920 may be implemented with the nonvolatile memory device 20 of FIG. 5 or the nonvolatile memory device 30 of FIG. 9. The memory controller 910 may control the nonvolatile memory device 920. The memory controller 910 may control data transfer between an external host and the nonvolatile memory device 920. The memory controller 910 may include a central processing unit CPU 911, a buffer memory RAM 912, a host interface 913 and a memory interface 914.

The central processing unit 911 may perform operations for the data transfer. The buffer memory 912 may be implemented by a dynamic random access memory (DRAM), a static random access memory (SRAM), a phase change random access memory (PRAM), a ferroelectric random access memory (FRAM), a resistance random access memory (RRAM), a magnetic random access memory (MRAM), etc. The buffer memory 912 may be an operational memory of the central processing unit 911. In some example embodiments, the buffer memory 912 may be included in the memory controller 910. In other example embodiments, the buffer memory 912 may be outside of the memory controller 910.

The host interface 913 may be coupled to the host, and the memory interface 914 may be coupled to the nonvolatile memory device 920. The central processing unit 911 may communicate with the host via the host interface 913. For example, the host interface 913 may be configured to communicate with the host using at least one of various interface protocols, such as a universal serial bus (USB), a multimedia card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), integrated drive electronics (IDE), and so on. Further, the central processing unit 911 may communicate with the nonvolatile memory device 920 via the memory interface 914.

In some example embodiments, the memory controller 910 may further include an error correction code (ECC) block 915 for error correction. In some example embodiments, the memory controller 910 may be built in the nonvolatile memory device 920, or the memory controller 910 and the nonvolatile memory device 920 may be implemented as separate chips. The memory system 900 may be implemented as a memory card, a solid state drive, and so on.

Figure 12:
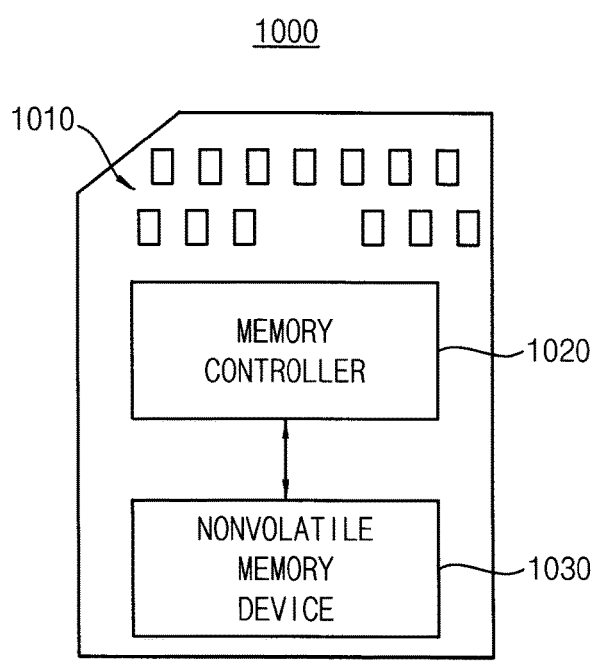
FIG. 12 is a block diagram illustrating a memory card according to example embodiments.

FIG. 12 is a block diagram illustrating a memory card according to example embodiments. Referring to FIG. 12, a memory card 1000 includes a plurality of connecting pins 1010, a memory controller 1020 and a nonvolatile memory device 1030. The connecting pins 1010 may be coupled to an external host to transfer signals between the host and the memory card 1000. The connecting pins 1010 may include a clock pin, a command pin, a data pin and/or a reset pin. The memory controller 1020 may receive data from the host, and may store the received data in the nonvolatile memory device 1030.

A memory cell array included in the nonvolatile memory device 1030 may include a plurality of memory blocks coupled to a plurality of string selection lines, a plurality of word lines, and a plurality of ground selection lines. The nonvolatile memory device 1030 may select one of the plurality of string selection lines, the plurality of word lines, and the plurality of ground selection lines as a test line, and select another one of the plurality of string selection lines, the plurality of word lines, and the plurality of ground selection lines as a reference line. The reference line may be of the same type as the test line. A substantial leakage current may not flow from the reference line. The nonvolatile memory device 1030 may charge the test line and the reference line to the same voltage level. After that, the nonvolatile memory device 1030 may float the test line and the reference line. The nonvolatile memory device 1030 may generate a test result signal, which indicates whether a leakage current flows from the test line, based on a change of a voltage of the test line and a change of a voltage of the reference line.

The nonvolatile memory device 1030 may be implemented with the nonvolatile memory device 20 of FIG. 5 or the nonvolatile memory device 30 of FIG. 9. The memory card 1000 may include a MMC, an embedded MMC (eMMC), a hybrid embedded MMC (hybrid eMMC), a secure digital (SD) card, a micro-SD card, a memory stick, an ID card, a personal computer memory card international association (PCMCIA) card, a chip card, a USB card, a smart card, a compact flash (CF) card, and so on. In some example embodiments, the memory card 1000 may be coupled to the host, such as a desktop computer, a laptop computer, a tablet computer, a mobile phone, a smart phone, a music player, a personal digital assistants (PDA), a portable multimedia player (PMP), a digital television, a digital camera, a portable game console, and so on.

Figure 13:
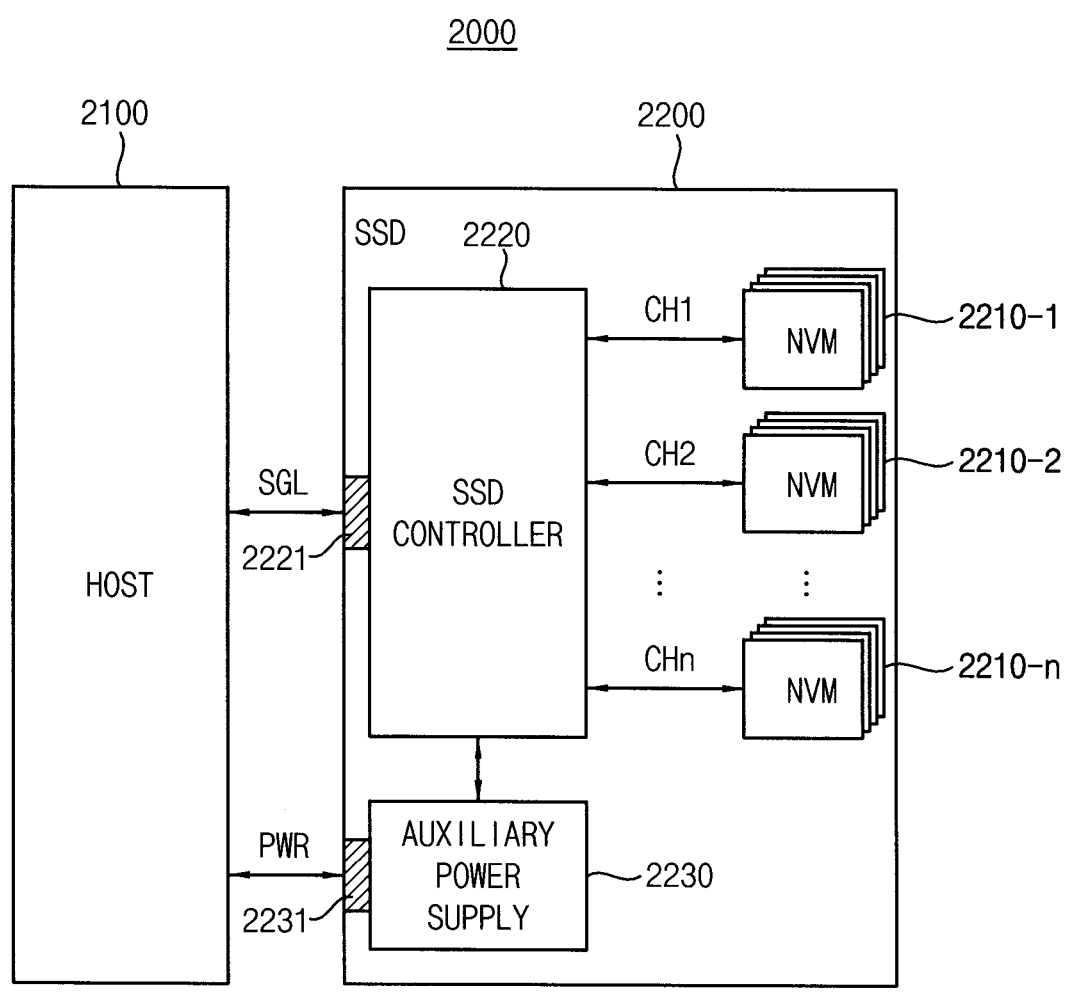
FIG. 13 is a block diagram illustrating a solid state drive (SSD) system according to example embodiments.

FIG. 13 is a block diagram illustrating a solid state drive (SSD) system according to example embodiments. Referring to FIG. 13, a SSD system 2000 includes a host 2100 and a SSD 2200. The SSD 2200 may include first through n-th nonvolatile memory devices 2210-1, 2210-2, ..., 2210-n and a SSD controller 2220. The first through n-th nonvolatile memory devices 2210-1, 2210-2, ..., 2210-n may be used as a storage medium of the SSD 2200.

A memory cell array included in each of the first through n-th nonvolatile memory devices 2210-1, 2210-2, ..., 2210-n may include a plurality of memory blocks coupled to a plurality of string selection lines, a plurality of word lines, and a plurality of ground selection lines. Each of the first through n-th nonvolatile memory devices 2210-1, 2210-2, ..., 2210-n may select one of the plurality of string selection lines, the plurality of word lines, and the plurality of ground selection lines as a test line, and select another one of the plurality of string selection lines, the plurality of word lines, and the plurality of ground selection lines as a reference line. The reference line may be of the same type as the test line. A substantial leakage current may not flow from the reference line. Each of the first through n-th nonvolatile memory devices 2210-1, 2210-2, ..., 2210-n may charge the test line and the reference line to the same voltage level. After that, each of the first through n-th nonvolatile memory devices 2210-1, 2210-2, ..., 2210-n may float the test line and the reference line. Each of the first through n-th nonvolatile memory devices 2210-1, 2210-2, ..., 2210-n may generate a test result signal, which indicates whether a leakage current flows from the test line, based on a change of a voltage of the test line and a change of a voltage of the reference line.

Each of the first through n-th nonvolatile memory devices 2210-1, 2210-2, ..., 2210-n may be implemented with the nonvolatile memory device 20 of FIG. 5 or the nonvolatile memory device 30 of FIG. 9. The SSD controller 2220 may be coupled to the first through n-th nonvolatile memory devices 2210-1, 2210-2, ..., 2210-n by first through n-th channels CH1, CH2, ..., CHn, respectively. The SSD controller 2220 may exchange a signal SGL with the host 2100 through a signal connector 2221. The signal SGL may include a command, an address and data. The SSD controller 2220 may perform a program operation and a read operation on the first through n-th nonvolatile memory devices 2210-1, 2210-2, ..., 2210-n according to the command received from the host 2100.

The SSD 2200 may further include an auxiliary power supply 2230. The auxiliary power supply 2230 may receive power PWR from the host 2100 through a power connector 2231 and provide power to the SSD controller 2220. The auxiliary power supply 2230 may be placed inside or outside the SSD 2200. For example, the auxiliary power supply 2230 may be placed in a main board and provide auxiliary power to the SSD 2200.

Figure 14:
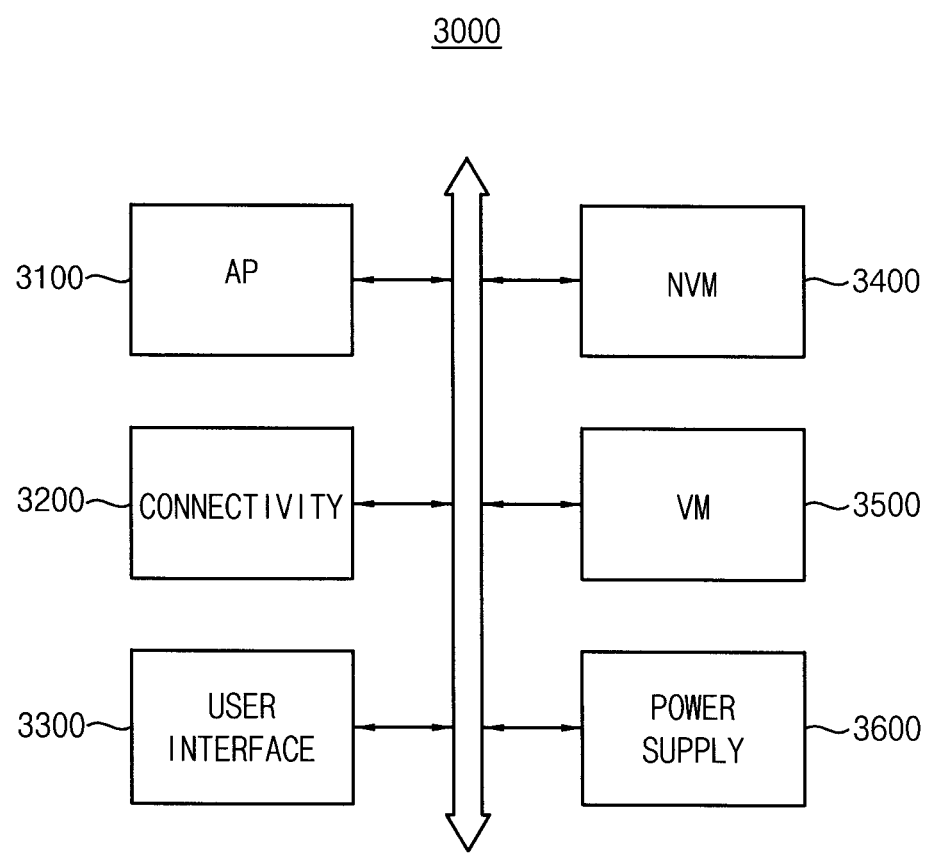
FIG. 14 is a block diagram illustrating a mobile system according to example embodiments.

FIG. 14 is a block diagram illustrating a mobile system according to example embodiments. Referring to FIG. 14, a mobile system 3000 includes an application processor AP 3100, a connectivity unit 3200, a user interface 3300, a nonvolatile memory device NVM 3400, a volatile memory device VM 3500 and a power supply 3600. In some embodiments, the mobile system 3000 may be a mobile phone, a smart phone, a personal digital assistant (PDA), a portable multimedia player (PMP), a digital camera, a music player, a portable game console, a navigation system, etc.

The application processor 3100 may execute applications, such as a web browser, a game application, a video player, etc. In some example embodiments, the application processor 3100 may include a single core or multiple cores. For example, the application processor 3100 may be a multi-core processor, such as a dual-core processor, a quad-core processor, a hexa-core processor, etc. The application processor 3100 may include an internal or external cache memory.

The connectivity unit 3200 may perform wired or wireless communication with an external device. For example, the connectivity unit 3200 may perform Ethernet communication, near field communication (NFC), radio frequency identification (RFID) communication, mobile telecommunication, memory card communication, universal serial bus (USB) communication, etc. In some embodiments, the connectivity unit 3200 may include a baseband chipset that supports communications, such as global system for mobile communications (GSM), general packet radio service (GPRS), wideband code division multiple access (WCDMA), high speed downlink/uplink packet access (HSxPA), etc.

The nonvolatile memory device 3400 may store a boot image for booting the mobile system 3000. A memory cell array included in the nonvolatile memory device 3400 may include a plurality of memory blocks coupled to a plurality of string selection lines, a plurality of word lines, and a plurality of ground selection lines. The nonvolatile memory device 3400 may select one of the plurality of string selection lines, the plurality of word lines, and the plurality of ground selection lines as a test line, and select another one of the plurality of string selection lines, the plurality of word lines, and the plurality of ground selection lines as a reference line. The reference line may be of the same type as the test line. A substantial leakage current may not flow from the reference line. The nonvolatile memory device 3400 may charge the test line and the reference line to the same voltage level. After that, the nonvolatile memory device 3400 may float the test line and the reference line. The nonvolatile memory device 3400 may generate a test result signal, which indicates whether a leakage current flows from the test line, based on a change of a voltage of the test line and a change of a voltage of the reference line.

The nonvolatile memory device 3400 may be implemented with the nonvolatile memory device 20 of FIG. 5 or the nonvolatile memory device 30 of FIG. 9. The volatile memory device 3500 may store data processed by the application processor 3100, or may operate as a working memory. The user interface 3300 may include at least one input device, such as a keypad, a touch screen, etc., and at least one output device, such as a speaker, a display device, etc. The power supply 3600 may supply a power supply voltage to the mobile system 3000.

In some embodiments, the mobile system 3000 may further include an image processor, and/or a storage device, such as a memory card, a solid state drive (SSD), a hard disk drive (HDD), a CD-ROM, etc. In some embodiments, the mobile system 3000 and/or components of the mobile system 3000 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

The foregoing is illustrative of the present inventive concept and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A leakage current detection device for a nonvolatile memory device having a memory cell array coupled to drive lines, the leakage current detection device comprising:
   a test detection circuit coupled between a test node and a test line, the test line corresponding to a first drive line from among the drive lines coupled to the memory cell array of the nonvolatile memory device, the test detection circuit configured to provide a supply voltage to the test node to charge the test line, to float the test node and the test line, and to decrease a voltage of the test node based on a leakage current flowing from the test line;
   a reference detection circuit coupled between a reference node and a reference line, the reference line corresponding to a second drive line from among the drive lines that is coupled to the memory cell array of the nonvolatile memory device and that is configured to deliver a drive signal of a type that is the same as a type of a drive signal delivered by the first drive line, the reference detection circuit configured to provide the supply voltage to the reference node to charge the reference line, to float the reference node and the reference line, and to decrease a voltage of the reference node based on a self-discharge of the reference line;
   a comparator configured to output a comparison signal by comparing the voltage of the test node with the voltage of the reference node; and
   a latch circuit configured to latch the comparison signal in response to a latch control signal, and to output the latched comparison signal as a test result signal,
   wherein the comparator is configured to change a logic level of the comparison signal when the voltage of the test node becomes lower than the voltage of the reference node by a predetermined voltage.

2. The leakage current detection device of claim 1, wherein the test detection circuit comprises:
   a first charge transistor coupled between the supply voltage and the test node, the first charge transistor including a gate configured to receive a charge control signal;
   a first enable transistor coupled between the test node and a ground voltage, the first enable transistor including a gate configured to receive an enable signal; and
   a first transmission transistor coupled between the test line and the test node, the first transmission transistor including a gate configured to receive a transmission control signal.

3. The leakage current detection device of claim 2, wherein the reference detection circuit comprises:
   a second charge transistor coupled between the supply voltage and the reference node, the second charge transistor including a gate configured to receive the charge control signal;
   a second enable transistor coupled between the reference node and the ground voltage, the second enable transistor including a gate configured to receive the enable signal; and
   a second transmission transistor coupled between the reference line and the reference node, the second transmission transistor including a gate configured to receive the transmission control signal.

4. The leakage current detection device of claim 3, further comprising:
   a control circuit configured to
   turn off the first enable transistor and the second enable transistor using the enable signal, turn on the first charge transistor and the second charge transistor using the charge control signal, and turn on the first transmission transistor and the second transmission transistor using the transmission control signal at a first time,
   turn off the first charge transistor and the second charge transistor using the charge control signal to float the test node and the reference node at a second time, and
   provide the latch control signal to the latch circuit at a third time,
   wherein a time duration between the second time and the third time corresponds to a detection time.

5. The leakage current detection device of claim 4, wherein the control circuit is configured to adjust a voltage level of the transmission control signal in a logic high state based on the type of the drive signal delivered by the test line and the type of the drive signal delivered by the reference line.

6. The leakage current detection device of claim 4, wherein the control circuit is configured to adjust a length of the detection time based on a magnitude of a leakage current of the test line to be detected.

7. The leakage current detection device of claim 1, wherein the test line and the reference line respectively correspond to word lines coupled to the memory cell array of the nonvolatile memory device.

8. The leakage current detection device of claim 1, wherein the test line and the reference line respectively correspond to string selection lines coupled to the memory cell array of the nonvolatile memory device.

9. The leakage current detection device of claim 1, wherein the test line and the reference line respectively correspond to ground selection lines coupled to the memory cell array of the nonvolatile memory device.

10. A nonvolatile memory device, comprising:
    a memory cell array including a plurality of memory cell blocks;
    a line selection circuit coupled to the plurality of memory cell blocks through a plurality of string selection lines, a plurality of word lines, and a plurality of ground selection lines, the line selection circuit being configured to couple a test line to one of the plurality of string selection lines, the plurality of word lines, and the plurality of ground selection lines based on a test line selection signal, and to couple a reference line to another one of the plurality of string selection lines, the plurality of word lines, and the plurality of ground selection lines based on a reference line selection signal;
    a leakage current detection device configured to charge the test line and the reference line to a same voltage, to float the test line and the reference line, and to generate a test result signal, which indicates whether a leakage current flows from the test line, based on a change of a voltage of the test line and a change of a voltage of the reference line; and a controller configured to generate the test line selection signal and the reference line selection signal, wherein the controller is further configured to store addresses of normal lines from among the plurality of string selection lines, the plurality of word lines and the plurality of ground selection lines, and generate the reference line selection signal corresponding to an address from among the stored addresses of the normal lines.

11. The nonvolatile memory device of claim 10, wherein the leakage current detection device comprises:

a test detection circuit coupled between a test node and the test line, the test detection circuit being configured to provide a supply voltage to the test node to charge the test line, to float the test node and the test line, and to decrease a voltage of the test node based on the leakage current flowing from the test line;

a reference detection circuit coupled between a reference node and the reference line, the reference detection circuit being configured to provide the supply voltage to the reference node to charge the reference line, to float the reference node and the reference line, and to decrease a voltage of the reference node based on a self-discharge of the reference line;

a comparator configured to output a comparison signal by comparing the voltage of the test node with the voltage of the reference node; and a latch circuit configured to latch the comparison signal in response to a latch control signal, and to output the latched comparison signal as the test result signal.

12. The nonvolatile memory device of claim 11, wherein the test detection circuit comprises:

a first charge transistor coupled between the supply voltage and the test node, the first charge transistor including a gate configured to receive a charge control signal;

a first enable transistor coupled between the test node and a ground voltage, the first enable transistor including a gate configured to receive an enable signal; and a first transmission transistor coupled between the test line and the test node, the first transmission transistor including a gate configured to receive a transmission control signal; and wherein the reference detection circuit comprises a second charge transistor coupled between the supply voltage and the reference node, the second charge transistor including a gate configured to receive the charge control signal;

a second enable transistor coupled between the reference node and the ground voltage, the second enable transistor including a gate configured to receive the enable signal; and a second transmission transistor coupled between the reference line and the reference node, the second transmission transistor including a gate configured to receive the transmission control signal.

13. The nonvolatile memory device of claim 10, wherein:

when the test line is coupled to one of the plurality of word lines, the reference line is coupled to another one of the plurality of word lines;

when the test line is coupled to one of the plurality of string selection lines, the reference line is coupled to another one of the plurality of string selection lines; and when the test line is coupled to one of the plurality of ground selection lines, the reference line is coupled to another one of the plurality of ground selection lines.

14. The nonvolatile memory device of claim 10, wherein the memory cell array corresponds to a three-dimensional memory array.

15. A method of leakage current detection for a nonvolatile memory device having a memory cell array coupled to drive lines, the method comprising:

coupling a test detection circuit between a test node and a test line, the test line corresponding to a first drive line from among the drive lines coupled to the memory cell array of the nonvolatile memory device, the test detection circuit providing a supply voltage to the test node to charge the test line, floating the test node and the test line, and decreasing a voltage of the test node based on a leakage current flowing from the test line;

coupling a reference detection circuit between a reference node and a reference line, the reference line corresponding to a second drive line from among the drive lines that is coupled to the memory cell array of the nonvolatile memory device and that is configured to deliver a drive signal of a type that is the same as a type of a drive signal delivered by the first drive line, the reference detection circuit providing the supply voltage to the reference node to charge the reference line, floating the reference node and the reference line, and decreasing a voltage of the reference node based on a self-discharge of the reference line;

outputting a comparison signal by comparing the voltage of the test node with the voltage of the reference node, a logic level of the comparison signal changing when the voltage of the test node becomes lower than the voltage of the reference node by a predetermined voltage; and latching the comparison signal in response to a latch control signal, and outputting the latched comparison signal as a test result signal.

16. The method of claim 15, wherein coupling the test detection circuit comprises:

coupling a first charge transistor between the supply voltage and the test node, the first charge transistor including a gate to receive a charge control signal;

coupling a first enable transistor between the test node and a ground voltage, the first enable transistor including a gate to receive an enable signal; and coupling a first transmission transistor between the test line and the test node, the first transmission transistor including a gate to receive a transmission control signal.

17. The method of claim 16, wherein coupling the reference detection circuit comprises:

coupling a second charge transistor between the supply voltage and the reference node, the second charge transistor including a gate to receive the charge control signal;

coupling a second enable transistor between the reference node and the ground voltage, the second enable transistor including a gate to receive the enable signal; and coupling a second transmission transistor between the reference line and the reference node, the second transmission transistor including a gate to receive the transmission control signal.

18. The method of claim 17, further comprising:

turning off the first enable transistor and the second enable transistor using the enable signal, turning on the first charge transistor and the second charge transistor using the charge control signal, and turning on the first transmission transistor and the second transmission transistor using the transmission control signal at a first time;

turning off the first charge transistor and the second charge transistor using the charge control signal to float the test node and the reference node at a second time; and providing the latch control signal at a third time;

wherein a time duration between the second time and the third time corresponds to a detection time.

19. The method of claim 18, wherein the voltage level of the transmission control signal is adjusted in a logic high state based on the type of the drive signal delivered by the test line and the type of the drive signal delivered by the reference line.

\* \* \* \* \*